(12) United States Patent
Li

(10) Patent No.: US 10,103,412 B2
(45) Date of Patent: Oct. 16, 2018

(54) UNIVERSAL RECHARGEABLE BATTERY CONSTITUTED BY EMPLOYING LITHIUM-ION BATTERY AND CONTROL METHOD

(71) Applicant: Song Li, Guangdong (CN)

(72) Inventor: Song Li, Shenzhen (CN)

(73) Assignee: Shenzhen Maigesong Electrical Technology Co. Ltd, Shenzhen (CN)

( * ) Notice: Subject to any disclaimer, the term of this patent is extended or adjusted under 35 U.S.C. 154(b) by 165 days.

(21) Appl. No.: 15/024,204

(22) PCT Filed: Dec. 9, 2014

(86) PCT No.: PCT/CN2014/086370
§ 371 (c)(1),
(2) Date: Mar. 23, 2016

(87) PCT Pub. No.: WO2015/039584
PCT Pub. Date: Mar. 26, 2015

(65) Prior Publication Data
US 2016/0254574 A1   Sep. 1, 2016

(30) Foreign Application Priority Data
Sep. 23, 2013 (CN) .......................... 2013 1 0436714

(51) Int. Cl.
*H02J 7/00* (2006.01)
*H01M 10/44* (2006.01)
(Continued)

(52) U.S. Cl.
CPC .......... *H01M 10/446* (2013.01); *G01R 31/36* (2013.01); *H01M 2/105* (2013.01);
(Continued)

(58) Field of Classification Search
USPC ........................................ 320/107, 108, 109
See application file for complete search history.

(56) References Cited

U.S. PATENT DOCUMENTS

2009/0058365 A1    3/2009   Goto

FOREIGN PATENT DOCUMENTS

CN          101373893 A       2/2009
CN          101599551 A      12/2009
(Continued)

OTHER PUBLICATIONS

1st Office Action dated May 8, 2017 by the JP Office.
(Continued)

*Primary Examiner* — Brian Ngo
(74) *Attorney, Agent, or Firm* — Yunling Ren

(57) ABSTRACT

A universal rechargeable battery constituted by employing a lithium-ion battery and a control method for the rechargeable battery are provided. The rechargeable battery includes: an outer packaging housing and, sequentially laminated and assembled within the outer packaging housing, a charging/discharging controller, a positive electrode crimping piece, a lithium-ion battery, and a negative electrode end cap. The charging/discharging controller includes: a charging/discharging controller housing and, arranged within the charging/discharging controller housing, a charging/discharging control circuit solder body, an insulating washer, and a charging/discharging controller support frame. The charging/discharging control circuit solder body is soldered to a lithium battery charging/discharging control circuit. The lithium-ion battery charging/discharging control circuit includes: a lithium-ion battery charging control circuit, a lithium-ion battery detection circuit, and a DC-DC step-down regulator discharging circuit that are soldered onto a circuit substrate and electrically connected respectively to
(Continued)

the lithium-ion battery, to a positive electrode end cap, and to the negative electrode end cap via the charging/discharging controller housing and the outer packaging housing.

5 Claims, 24 Drawing Sheets

(51) Int. Cl.
*H01M 2/10* (2006.01)
*H01M 10/0525* (2010.01)
*H01M 10/46* (2006.01)
*H01M 10/48* (2006.01)
*G01R 31/36* (2006.01)
*H01M 10/42* (2006.01)

(52) U.S. Cl.
CPC ..... *H01M 10/0525* (2013.01); *H01M 10/425* (2013.01); *H01M 10/44* (2013.01); *H01M 10/443* (2013.01); *H01M 10/46* (2013.01); *H01M 10/48* (2013.01); *H01M 10/486* (2013.01); *H02J 7/007* (2013.01); *H02J 7/0029* (2013.01); *H02J 7/0042* (2013.01); *H02J 7/0091* (2013.01); *H01M 10/4207* (2013.01); *H01M 2010/4271* (2013.01); *H02J 2007/004* (2013.01); *H02J 2007/0037* (2013.01); *H02J 2007/0039* (2013.01); *H02J 2007/0067* (2013.01)

(56) References Cited

FOREIGN PATENT DOCUMENTS

| | | |
|---|---|---|
| CN | 102299392 A | 12/2011 |
| CN | 202142621 U | 2/2012 |
| CN | 102299392 B | 6/2013 |
| CN | 103490099 A | 1/2014 |
| CN | 103490112 A | 1/2014 |
| CN | 203536530 U | 4/2014 |
| CN | 203536537 U | 4/2014 |
| EP | 1029385 B1 | 10/2005 |
| JP | 7192770 A | 7/1995 |
| JP | 11185824 A | 7/1999 |
| JP | 200834398 A | 2/2008 |
| JP | 2009055755 A | 3/2009 |
| JP | 2009268345 A | 11/2009 |
| JP | 2009284753 A | 12/2009 |
| JP | 2011158267 A | 8/2011 |
| JP | 2013516957 A | 5/2013 |

OTHER PUBLICATIONS

1st Office Action dated Jun. 19, 2017 by the KR Office.
1st Office Action dated Mar. 19, 2015 by the CN Office.
ISR dated Dec. 12, 2014 by the WIPO Office.
EESR dated Mar. 3, 2017 by the EP Office.
International Search Report issued in PCT Application No. PCT/CN2014/086370 dated Dec. 12, 2014.
The Notice of Allowance received in the counterpart Korean application No. 10-2016-7008386 dated Feb. 14, 2018, issued by the KIPO.

UNIVERSAL RECHARGEABLE BATTERY CONSTITUTED BY EMPLOYING LITHIUM-ION BATTERY AND CONTROL METHOD

TECHNICAL FIELD

The present disclosure generally relates to a field of rechargeable battery or electrical power source, and more particularly, to a universal rechargeable battery constituted by employing lithium-ion battery and control method.

BACKGROUND

A lithium-ion rechargeable battery (hereinafter referred to as lithium-ion battery), which is an ideal rechargeable battery replacing the traditional battery and the Ni—H rechargeable battery, Li-ion batteries are advantageous in their large energy density, fast chargeable/dischargeable characteristics, longer cycle life, low self-discharge, harmless and no memory effect. However, known lithium-ion battery has a relative high output voltage, and the output voltage varies according to different positive electrode systems. Commercial available lithium-ion batteries have nominal voltages ranging from 3.2V to 3.8V, and with a development of lithium-ion battery technology, the lithium-ion battery may have an even higher nominal voltage. Obviously, lithium-ion batteries cannot be used as direct substitutes for universal batteries with a nominal voltage of 1.5V or Ni—H rechargeable batteries with a nominal voltage of 1.2V.

Although lithium-ion battery has better charging/discharging characteristics, it has problems of poor overcharging/overdischarging toleration and poor charging overheat/discharging overheat toleration. If failing to control the charging/discharging properly, the lithium-ion battery may be ageing rapidly and damaged, or even may cause fire or explosion. Accordingly, a charging/discharging operation of the lithium-ion battery has to be controlled strictly according to the charging/discharging technical specifications of the lithium-ion battery.

Currently known lithium-ion battery structure package processes include mainly the following four types: i) a negative electrode outer housing lithium-ion battery package constituted by connecting the negative electrode current collector with the outer housing (typically, a steel outer housing package is employed); ii) a positive electrode outer housing lithium-ion battery package constituted by connecting the positive electrode current collector with the outer housing (typically, an aluminum outer housing package is employed); iii) a quasi-insulated outer housing lithium-ion battery package employing a soft packaging (typically, an aluminum-plastic composite film material packaging is employed); and iv) an insulated outer housing lithium-ion battery package having an outer housing constituted by an insulation packaging material (typically, a polypropylene and polyethylene outer housing package is employed).

Since uses of universal primary battery and Ni—H rechargeable battery have long history and have been standardized, methods for detecting low power of the battery using its output voltage have been developed in many universal battery application fields. For example, in electronic devices such as digital cameras, MP3, MP4, electronic smart locks, electronic instruments and the like, determination of battery low power is performed by detecting real time output voltage of the battery.

In addition, PCs, tablet computers, cell phones are highly popularized, and the rechargeable batteries use the USB interface of the computer and normal lithium-ion battery charging adapter as charging power sources, which may reduce acquisition cost and save social resources.

To solve the above problems, a patent, which number is 201110219892.0 about entitled with "rechargeable battery constituted by employing lithium-ion battery and control method" was published by the Chinese SIPO, in which the lithium-ion battery and the discharge control circuit are integrally packaged to constitute a universal rechargeable battery. However, rechargeable battery has few disadvantageous in the following aspects.

I. The rechargeable battery does not include lithium-ion battery charging control and charging overheat protection therein.

Since the rechargeable battery does not include lithium-ion battery charging control and charging overheat protection circuit therein, a diode is required during charging to isolate a charging circuit and a discharging circuit, and a dedicated external charging device having a lithium-ion battery charging control circuit and a temperature sensing circuit is necessary for charging. Accordingly, there exists following technical defects: i) during the charging, the forward voltage drop of the diode varies according to the differences of the operating current and temperature, thereby lowering accuracy of the charging control circuit to detect the lithium-ion battery and control the charging. An undercharge problem of the lithium-ion battery may occur when the diode has a relative higher forward voltage drop, and an overcharge problem of the lithium-ion battery may occur when the diode has a relative lower forward voltage drop, thereby lowering the charging and safety characteristics of the lithium-ion battery; ii) since the charging loop is connected with an isolation diode, the charging input voltage of the rechargeable battery is raised, and since the known lithium-cobalt lithium-ion battery has an upper threshold charging voltage up to 4.35V which may increase in the future, the undercharge problem of the lithium-ion battery may still exist in the case where the charging input voltage is at a lower limit and the forward voltage drop of the isolation diode is at an upper limit, even if schottky devices having lower forward voltage drop are employed when the battery is charged using a known universal lithium-ion battery charging adaptor or a USB interface of the computer having a nominal voltage of 5V±0.25V. Such a problem may be solved by employing a boosting circuit in the external charging device, however, this may cause problems of increasing cost, decreasing efficiency and reliability and the like of the charging device; and iii) the external temperature sensing circuit can only detect the temperature of the lithium-ion battery indirectly through outer packaging housing or the electrodes of the rechargeable battery, thereby lowering the accuracy of sensing the temperature of the lithium-ion battery during the charging and leading to problems of decreasing cycle life and safety due to charging overheat of the lithium-ion battery in the rechargeable battery.

II. The rechargeable battery does not include discharging overheat protection of the lithium-ion battery.

The rechargeable battery does not include lithium-ion battery temperature sensing and control circuit therein, such that the rechargeable battery does not have an overheat protection function during discharging process of the lithium-ion battery. Accordingly, there is a risk for the lithium-ion battery to work at a temperature over its upper threshold operating temperature when the rechargeable battery is discharged at a high discharging rate in a hot environment, thereby leading to problems of decreasing cycle life and safety of the lithium-ion battery.

III. A charging/discharging controller has complex structure and assembling process.

A circuit connection between a negative electrode of the charging/discharging controller and the packaging housing of the rechargeable battery employs a radial elastic clamping connection structural design. During the assembling of the rechargeable battery, an elastic negative electrode is required to be pushed radially to a predetermined position before the charging/discharging controller is able to be pushed into the packaging housing of the rechargeable battery. In addition, the elastic negative electrode is a moveable part with a structure occupying a relative larger inner space inside the charging/discharging controller, causing it difficult to seal the charging/discharging controller. Accordingly, the charging/discharging controller has a relative larger volume, complex and difficult manufacturing process, and it is difficult to realize an automatic mass production or the waterproof sealing thereof. Therefore, there exist problems of low power capacity, high producing cost, and possible circuit failure after getting wet in the rechargeable battery.

SUMMARY

An object of the present disclosure is to provide a universal rechargeable battery constituted by employing lithium-ion battery which has a regulated voltage output of 1.5V and a regulated voltage output during low power of the lithium-ion battery of 1.1V, may be charged by using a computer USB interface or a universal lithium-ion battery charging adapter, has a shaping structure and discharge characteristics satisfying technical specifications of GB/T 8897.2-2013 and IEC 60086-2, and may be used as direct substitutes for known universal primary batteries and Ni—H rechargeable batteries. The battery has a high performance, and has a simple charging/discharging controller structure and a simple assembling process, which may facilitate the automatic mass production. A charging/discharging controller housing is used as the electrode structure for connecting the negative electrode of the lithium-ion battery into the charging/discharging control circuit of the lithium-ion battery, a significant inner space of the charging/discharging controller may be saved and a moveable part obstructing the sealing of the charging/discharging controller may be eliminated, and thus waterproof sealing thereof may be realized and a problem of circuit failure after getting wet may be prevented. Meanwhile, it may facilitate improving power capacity of the universal rechargeable battery and lowering the manufacturing cost. In addition, a charging/discharging control circuit is provided in the charging/discharging controller, thereby controlling and protecting the charging/discharging process of the lithium-ion battery, and improving cycle life and safety of the lithium-ion battery.

Another object of the present disclosure is to provide a method for controlling the universal rechargeable battery constituted by employing lithium-ion battery of the present disclosure, according to the required charging/discharging operation technical specification of the lithium-ion battery, the following advantages may be obtained by providing the lithium-ion battery charging/discharging control circuit: charging/discharging process of the lithium-ion battery may be controlled and protected; overcharge, overdischarge, discharging rate, discharging rate, charging overheat and discharging overheat may be protected; cycle life and safety of the lithium-ion battery may be improved; the universal rechargeable battery may have a regulated voltage output of 1.5V and a regulated voltage output during low power of the lithium-ion battery of 1.1V, and the universal rechargeable battery may be charged using a computer USB interface or a universal lithium-ion battery charging adaptor, and has a shaping structure and discharge characteristics satisfying technical specifications of GB/T 8897.2-2013 and IEC 60086-2, therefore may be used as direct substitutes for known universal primary batteries and Ni—H rechargeable batteries. Performances of the universal rechargeable battery may be fully improved.

In order to realize the above objections, the present disclosure provides a universal rechargeable battery constituted by employing a lithium-ion battery, including: an outer packaging housing, and a charging/discharging controller, a positive electrode crimping piece, a lithium-ion battery, and a negative electrode end cap that are successively press assembled in the outer packaging housing, wherein the charging/discharging controller includes: a charging/discharging controller housing, and a charging/discharging control circuit solder body, an insulating washer and a charging/discharging controller support frame provided in the charging/discharging controller housing, wherein the charging/discharging control circuit solder body is soldered with a lithium-ion battery charging/discharging control circuit including: a lithium-ion battery charging control circuit, a lithium-ion battery detection circuit and a DC-DC step-down regulator discharging circuit soldered on a circuit substrate respectively, the circuit substrate is electrically connected to the lithium-ion battery and a positive electrode end cap respectively, and the circuit substrate is electrically connected to the negative electrode end cap via the charging/discharging controller housing and the outer packaging housing.

The present disclosure further provides a method for controlling a universal rechargeable battery constituted by employing lithium-ion battery, wherein the universal rechargeable battery constituted by employing lithium-ion battery includes: an outer packaging housing; and a charging/discharging controller, a positive electrode crimping piece, a lithium-ion battery, and a negative electrode end cap that are successively press assembled in the outer packaging housing, wherein the charging/discharging controller includes a charging/discharging controller housing, and a charging/discharging control circuit solder body, an insulating washer and a charging/discharging controller support frame provided in the charging/discharging controller housing, wherein the charging/discharging control circuit solder body is soldered with a lithium-ion battery charging/discharging control circuit including: a lithium-ion battery charging control circuit, a lithium-ion battery detection circuit and a DC-DC step-down regulator discharging circuit soldered on a circuit substrate respectively, the circuit substrate is electrically connected to the lithium-ion battery and a positive electrode end cap respectively, and the circuit substrate is electrically connected to the negative electrode end cap via the charging/discharging controller housing and the outer packaging housing, wherein the method for controlling the universal rechargeable battery includes the following control conditions:

control condition 1, after a charging power source is connected to the universal rechargeable battery, the lithium-ion battery charging/discharging control circuit performs a charging status upon detection of the charging voltage connection, and during the charging status, the lithium-ion battery charging/discharging control circuit cutoffs the regulated discharge voltage output and performs charging of the lithium-ion battery;

control condition 2, during the charging status, the lithium-ion battery charging/discharging control circuit detects an output voltage of the lithium-ion battery and selects a charging scheme of trickling charge, constant-current charge or constant-voltage charge to charge the lithium-ion battery according to the output voltage of the lithium-ion battery, and during the charging status, the lithium-ion battery charging control circuit detects a maximum threshold output current of the charging power source, and charges the lithium-ion battery at the maximum threshold output current of the charging power source when the maximum threshold output current of the charging power source is smaller than a preset charging current value, and cutoffs the charging of the lithium-ion battery when a charging current during the constant-voltage charge is decreased to a preset fully charged determination current;

control condition 3, when the charging power source is disconnected from the universal rechargeable battery, the lithium-ion battery charging/discharging control circuit detects the disconnection of the charging power source, and discharges remaining power stored in a filter capacitor during the charging, such that a voltage across a positive electrode and a negative electrode of the universal rechargeable battery drops rapidly to be equal to or lower than a maximum open circuit voltage and a discharging status is performed, and during the discharging status, the lithium-ion battery charging/discharging control circuit cutoffs a charging and performs a regulated voltage discharge, and performs a regulated voltage output according to control condition 4;

control condition 4, during the discharging status, the lithium-ion battery charging/discharging control circuit detects the output voltage of the lithium-ion battery, and performs a regulated voltage output by: decreasing the output voltage of the lithium-ion battery to a first output voltage when the output voltage of the lithium-ion battery is greater than a low power voltage $V_L$; decreasing the output voltage of the lithium-ion battery to a second output voltage when the output voltage of the lithium-ion battery is greater than a discharge cutoff voltage $V_D$ while equal to or lower than the low power voltage $V_L$, and restoring the output of the lithium-ion battery to the first voltage when the output voltage of the charged lithium-ion battery is greater than $V_L+\Delta V_1$, wherein $V_L$ is a preset low power voltage of the lithium-ion battery, $\Delta V_1$ is a preset backlash voltage of the lower power voltage detection threshold of the lithium-ion battery, and $V_D$ is a preset discharge cutoff voltage of the lithium-ion battery;

control condition 5, during the discharging status, the lithium-ion battery charging/discharging control circuit detects the output voltage of the lithium-ion battery, and cutoffs the regulated voltage output when the output voltage of the lithium-ion battery drops to be equal to or lower than the discharge cutoff voltage $V_D$ and restores the regulated voltage output according to control condition 4 when the output voltage of the charged lithium-ion battery is greater than $V_D+\Delta V_2$, wherein $\Delta V_2$ is a preset backlash voltage of the discharge cutoff voltage detection threshold of the lithium-ion battery;

control condition 6, during the charging of the universal rechargeable battery, the lithium-ion battery charging/discharging control circuit detects a temperature of the lithium-ion battery, and cutoffs the charging of the lithium-ion battery when the temperature of the lithium-ion battery raises to a charging upper threshold temperature $T_{CH}$ and restores the charging of the lithium-ion battery when the temperature of the lithium-ion battery decreases to be lower than $T_{CH}-\Delta T_1$, wherein $T_{CH}$ is a preset charging upper threshold temperature of the lithium-ion battery, and $\Delta T_1$ is a preset backlash temperature corresponding to a backlash voltage of the $T_{CH}$ detection threshold;

control condition 7, during the discharging of the universal rechargeable battery, the lithium-ion battery charging/discharging control circuit detects the temperature of the lithium-ion battery, and cutoffs the regulated voltage output when the temperature of the lithium-ion battery raises to a discharging upper threshold temperature $T_{DH}$ and restores the regulated voltage output when the temperature of the lithium-ion battery decreases to be lower than $T_{DH}-\Delta T_2$, wherein $T_{DH}$ is a preset discharging upper threshold temperature of the lithium-ion battery, and $\Delta T_2$ is a preset backlash temperature corresponding to a backlash voltage of the $T_{DH}$ detection threshold;

the lithium-ion battery is charged according to control condition 2 when control condition 1 determines that the charging power source is connected to the universal rechargeable battery and control condition 6 allows for the charging of the lithium-ion battery, and the charging of the lithium-ion battery is cutoff when control condition 6 prohibits the charging of the lithium-ion battery; and output power of the lithium-ion battery is stepped-down and regulated output according to control condition 4 when control condition 3 determines that the universal rechargeable battery is disconnected from the charging power source and both control condition 5 and control condition 7 allow for the discharging output of the lithium-ion battery, and the lithium-ion battery charging/discharging control circuit cutoffs the regulated voltage output when either one of control condition 5 and control condition 7 prohibits the discharging output of the lithium-ion battery.

The present disclosure may provide the following advantages: the universal rechargeable battery constituted by employing lithium-ion battery according to the present disclosure has a regulated voltage output of 1.5V and a regulated voltage output during low power of the lithium-ion battery of 1.1V, and the universal rechargeable battery may be charged using a computer USB interface or a universal lithium-ion battery charging adaptor, and has a shaping structure and discharge characteristics satisfying technical specifications of GB/T 8897.2-2013 and IEC 60086-2, therefore may be used as direct substitutes for known universal primary batteries and Ni—H rechargeable batteries. The battery has a simple charging/discharging controller structure and a simple assembling process, which may facilitate the automatic mass production. A charging/discharging controller housing is used as the electrode structure for connecting the negative electrode of the lithium-ion battery into the lithium-ion battery charging/discharging control circuit, a significant inner space of the charging/discharging controller may be saved and a moveable part obstructing the sealing of the charging/discharging controller may be eliminated, and thus waterproof sealing thereof may be realized and a problem of circuit failure after getting wet may be prevented. Meanwhile, it may facilitate improving power capacity of the universal rechargeable battery and lowering the manufacturing cost. In addition, a lithium-ion battery charging/discharging control circuit is provided in the charging/discharging controller, thereby controlling and protecting the charging/discharging process of the lithium-ion battery, and improving cycle life and safety of the lithium-ion battery. In the method for controlling the universal rechargeable battery constituted by employing lithium-ion battery of the present disclosure, according to the required charging/discharging operation technical specification of the lithium-ion battery, the following advantages may be obtained by providing the charging/discharging control circuit: charging/discharging process of the lithium-ion battery may be controlled and protected; charging mode, charging rate, overcharge, overdischarge, discharging rate and discharging overheat during the process of the charging/discharging of the lithium-ion battery may be controlled and protected; cycle life and safety of the lithium-ion battery may be improved; the universal rechargeable battery may have a regulated voltage output of 1.5V and a regulated voltage output during low power of the lithium-ion battery of 1.1V, and the universal rechargeable battery may be charged using a computer USB interface or a universal lithium-ion battery charging adaptor, and has a shaping structure and discharge characteristics satisfying technical specifications of GB/T 8897.2-2013 and IEC 60086-2, therefore may be used as direct substitutes for known universal primary batteries and Ni—H rechargeable batteries; and may be superior to the known universal primary batteries in the aspects of cycling charging/discharging, constant output voltage during the discharging process and environment protection, and may be superior to the known Ni—H rechargeable batteries in the aspects of having a nominal output voltage of 1.5V, constant output voltage during the discharging process, short charging time, no memory effect and long cycle life. Performances of the universal rechargeable battery may be fully improved.

For a further understanding of the features of the present disclosure and its technical contents, reference is made to the following detailed description and drawings of the present disclosure. However, parameters illustrated in the drawings and embodiments are provided for reference and illustration only, which is not used to limit the present disclosure.

BRIEF DESCRIPTION OF THE DRAWINGS

Detailed embodiments of the present disclosure are described in detail with reference to the drawings, such that the technical solution and other advantages of the present disclosure are apparent. In the drawings.

Figure 1:
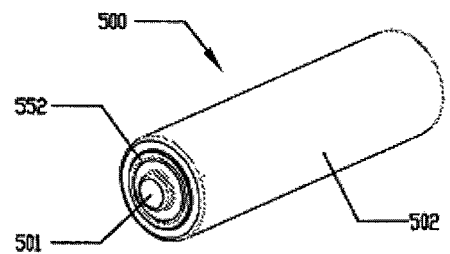
FIG. 1 is a structural schematic diagram of a positive electrode end of the assembled rechargeable battery of a R6 rechargeable battery constituted by employing lithium-ion battery.
Figure 2:
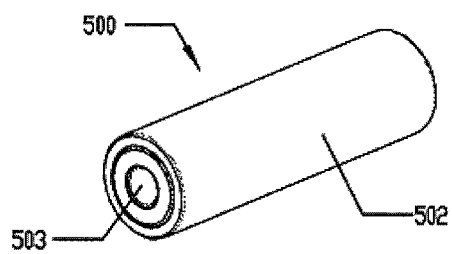
FIG. 2 is a structural schematic diagram of a negative electrode end of the assembled rechargeable battery of a R6 rechargeable battery constituted by employing lithium-ion battery.

battery and lithium iron phosphate (LiFePO$_4$) battery employed in the rechargeable battery.

DETAILED DESCRIPTION

Hereinafter, the present disclosure will be described in detail in connection with preferred embodiments and its drawings, so as to further describe the technical means and effects of the present disclosure.

The present disclosure provides a universal rechargeable battery constituted by employing lithium-ion battery, wherein the rechargeable battery includes: an outer packaging housing and a charging/discharging controller, a positive electrode crimping piece, a lithium-ion battery and a negative electrode end cap that are successively press assembled in the outer packaging housing. The charging/discharging controller is provided at an end thereof with a positive electrode end cap having a positive electrode contact point exposed outside the outer packaging housing, and the positive electrode contact point is used as a positive electrode of the universal rechargeable battery. An end of the negative electrode end cap is provided with a negative electrode contact point exposed outside the outer packaging housing, and the negative electrode contact point is used as a negative electrode of the universal rechargeable battery.

Referring to FIGS. 7-13, 20-26, 33-39, 46-52 and 54, the charging/discharging controller 550 (750, 850, 950) includes: a charging/discharging controller housing 551 (751, 851, 951) and a charging/discharging control circuit solder body 560 (760, 860, 960), a charging/discharging controller support frame 552 (752, 852, 952), and an insulating washer 563 (763, 863, 963) provided in the charging/discharging controller housing 551 (751, 851, 951). The charging/discharging control circuit solder body 560 (760, 860, 960) is soldered with a lithium-ion battery charging/discharging control circuit.

In detail, the charging/discharging controller 550 has a structure satisfying technical specifications for a R6 rechargeable battery, the charging/discharging controller 750 has a structure satisfying technical specifications for a R03 rechargeable battery, the charging/discharging controller 850 has a structure satisfying technical specifications for a R1 rechargeable battery, and the charging/discharging controller 950 has a structure satisfying technical specifications for a R8D425 rechargeable battery.

Structure of the charging/discharging controller: the charging/discharging controller is constituted by assembling the charging/discharging controller support frame, the charging/discharging control circuit solder body and the insulating washer in the charging/discharging controller housing, and soldering a bead of the charging/discharging controller housing to a copper coated portion of a V− terminal of the lithium-ion battery charging/discharging control circuit of the PCB2 circuit substrate after bead-sealing the charging/discharging controller housing. Structure of lithium-ion battery charging/discharging control circuit soldered in the charging/discharging control circuit solder body: it is constituted by soldering the PCB1 circuit substrate soldered with elements of the lithium-ion battery charging/discharging control circuit and the PCB2 circuit substrate together with connection pins, and soldering the positive electrode end cap on the PCB1 circuit substrate and soldering the positive electrode crimping piece on the PCB2 circuit substrate. The connection pins are formed of metal material having high thermal conductivity and high electrical conductivity.

The charging/discharging control circuit solder body 560 (760, 860, 960) is assembled by following steps: step 1, soldering elements of the lithium-ion battery charging/discharging control circuit other than a thermistor Rt on both sides of a PCB1 circuit substrate 571 (771, 871, 971) and constituting a PCB1 solder body 570 (770, 870, 970); step 2, soldering the thermistor Rt on the front side of a PCB2 circuit substrate 581 (781, 881, 981) and constituting a PCB2 solder body 580 (780, 880, 980); step 3, soldering the PCB1 solder body 570 (770, 870, 970) and the PCB2 solder body 580 (780, 880, 980) by inter board connection pin 562 (762, 862, 962); step 4, soldering a positive electrode end cap 501 (701, 801, 901) at a copper coated portion of a V+ terminal of the lithium-ion battery charging/discharging control circuit of the PCB1 circuit substrate 571 (771, 871, 971); and step 5, soldering a positive electrode crimping piece 561 (761, 861, 961) at a copper coated portion of a node Jb+ of the lithium-ion battery charging/discharging control circuit at the back side of the PCB2 circuit substrate 581 (781, 881, 981) and constituting the charging/discharging control circuit solder body 560 (760, 860, 960).

Figure 54:
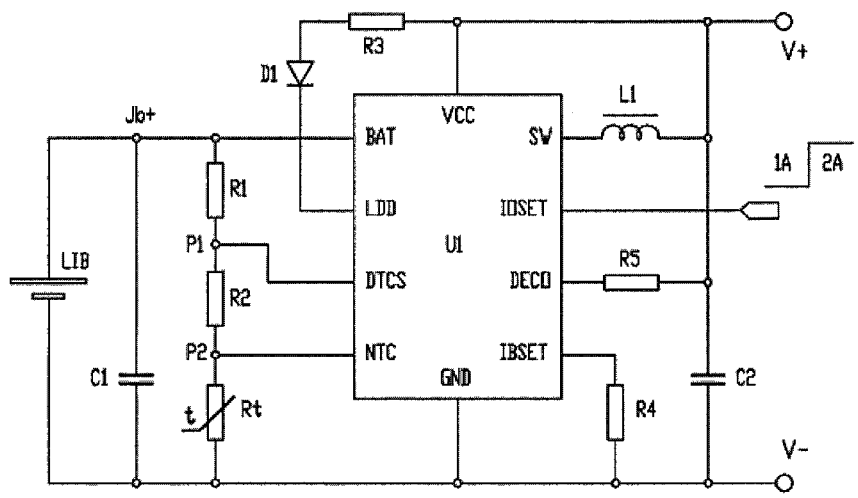
FIG. 54 is a schematic diagram illustrating an electrical principle of a lithium-ion battery charging/discharging control circuit of the rechargeable battery constituted by employing monolithic integration rechargeable battery control chip in the rechargeable battery of the present disclosure.

The charging/discharging controller 550 (750, 850, 950) is assembled by following steps: step 1, assembling the charging/discharging controller support frame 552 (752, 852, 952) into the charging/discharging controller housing 551 (751, 851, 951); step 2, assembling the charging/discharging control circuit solder body 560 (760, 860, 960) and the insulating washer 563 (763, 863, 963) into the charging/discharging controller support frame 552 (752, 852, 952); step 3, bead-sealing the charging/discharging controller housing 551 (751, 851, 951) using a beading machine; step 4, soldering a bead of the beaded charging/discharging controller housing 551 (751, 851, 951) with a copper coated portion of a V− terminal of the lithium-ion battery charging/discharging control circuit of the PCB2 circuit substrate 581 (781, 881, 981); and step 5, injecting packaging adhesive via an injection hole of the PCB2 circuit substrate 581 (781, 881, 981), and constituting the charging/discharging controller 550 (750, 850, 950) after curing the packaging adhesive. In the assembled charging/discharging controller 550 (750, 850, 950), the charging/discharging controller housing 551 (751, 851, 951) is a connecting electrode of the V− terminal of the lithium-ion battery charging/discharging control circuit, the positive electrode end cap 501 (701, 801, 901) is a connecting electrode of the V+ terminal of the lithium-ion battery charging/discharging control circuit, and the positive electrode crimping piece 561 (761, 861, 961) is a connecting electrode of the node Jb+ (as illustrated in FIG. 54) of the lithium-ion battery charging/discharging control circuit.

The charging/discharging controller support frame 552 (752, 852, 952) is made of a light transmitting insulation material, is used for mounting the charging/discharging control circuit solder body 560 (760, 860, 960), and is used for transmitting a light signal emitted from a light emitting diode D1 indicating charging status of the universal rechargeable battery outside the universal rechargeable battery, thereby displaying the charging status of the universal rechargeable battery.

The lithium-ion battery is selected from a negative electrode outer housing packaging lithium-ion battery unit, a positive electrode outer housing packaging lithium-ion battery unit or a soft packaging lithium-ion battery unit.

Assembling the universal rechargeable battery using the lithium-ion battery unit includes the following steps: step 1, soldering the negative electrode end cap to the negative electrode of the lithium-ion battery using a spot welder; step 2, after accommodating the charging/discharging controller, the lithium-ion battery unit and the negative electrode end cap into the outer packaging housing along an axis direction and positioning and fixing the same at an insulation position of a beading machine, bead-sealing the outer packaging housing to complete the assembling of the universal rechargeable battery; and step 3, coating or applying an insulation and finishing material outside outer packaging housing of the assembled universal rechargeable battery to constitute the finished universal rechargeable battery. Embodiments employing such an assembling means include: a R6 rechargeable battery constituted by employing a negative electrode outer housing packaging lithium-ion battery unit, a R03 rechargeable battery constituted by employing a positive electrode outer housing packaging lithium-ion battery unit, and a R1 rechargeable battery constituted by employing a negative electrode outer housing packaging lithium-ion battery unit.

In the present disclosure, each of the positive electrode end cap, the outer packaging housing, the negative electrode end cap, the charging/discharging controller housing and the connecting pin is formed with a metal material having high thermal conductivity and high electrical conductivity undergoing a conductive anti-oxidation treatment at a surface thereof. A molding process of the outer packaging housing is a prefabrication thin-wall tubular material molding, a sheet material drum molding or a sheet material rolling molding. A molding process of the charging/discharging controller housing is a prefabrication thin-wall tubular material molding, a sheet material drum molding or a sheet material rolling molding. The positive electrode crimping piece is formed with a metal material having high elastic recovery, high thermal conductivity and high electrical conductivity undergoing a conductive anti-oxidation treatment at a surface thereof. The PCB1 circuit substrate and the PCB2 circuit substrate are formed with insulating material having a relative higher thermal conductively and may dissipate heat by transferring heat generated by the lithium-ion battery and the elements to the outer packaging housing.

The heat dissipation principle of the assembled universal rechargeable battery is described as follow: heat generated by the power devices of the lithium-ion battery charging/discharging control circuit is dissipated by transmitting the same to the outer packaging housing of the universal rechargeable battery via the PCB1 circuit substrate, the PCB2 circuit substrate, copper coating heat conducting structures of the circuit, and the charging/discharging controller housing. Heat generated by the lithium-ion battery is dissipated, at the positive electrode end of the lithium-ion battery, by transmitting the same to the outer packaging housing of the universal rechargeable battery via the positive electrode crimping piece, the PCB circuit substrates (PCB1 and PCB2), copper coating heat conducting structures of the circuit, and the charging/discharging controller housing. Heat generated by the lithium-ion battery is dissipated, at the negative electrode end of the lithium-ion battery, by transmitting the same to the outer packaging housing of the universal rechargeable battery via the negative electrode end cap.

The charging/discharging control circuit solder body is soldered with a lithium-ion battery charging/discharging control circuit including a lithium-ion battery charging control circuit, a lithium-ion battery detection circuit and a DC-DC step-down regulator discharging circuit soldered on the circuit substrate respectively, and the circuit substrate is electrically connected to the lithium-ion battery and the positive electrode end cap respectively, and the circuit substrate is electrically connected to the negative electrode end cap via the charging/discharging controller housing and the outer packaging housing. The universal rechargeable battery of the present disclosure is charged with a computer USB interface or a universal lithium-ion battery charging adapter. When the universal rechargeable battery is connected to a charging power source and the lithium-ion battery detection circuit detects a connected charging voltage, the DC-DC step-down regulator discharging circuit is controlled to cutoff the regulated voltage output, and the lithium-ion battery charging control circuit is controlled to perform charging of the lithium-ion battery.

The lithium-ion battery charging/discharging control circuit of the universal rechargeable battery constituted by employing lithium-ion battery of the present disclosure has a charging status in connection with the charging power source and a discharging status disconnected from the charging power source. A charging/discharging control method of the universal rechargeable battery includes the flowing control conditions.

Control condition 1, after the charging power source is connected to the universal rechargeable battery, the lithium-ion battery charging/discharging control circuit performs the charging status upon detection of the charging power source connection. During the charging status, the lithium-ion battery charging/discharging control circuit cutoffs the regulated discharge voltage output and performs charging of the lithium-ion battery.

Control condition 2, during the charging status, the lithium-ion battery charging/discharging control circuit detects an output voltage of the lithium-ion battery and selects a charging scheme of trickling charge, constant-current charge or constant-voltage charge to charge the lithium-ion battery according to the output voltage of the lithium-ion battery. During the charging process, the lithium-ion battery charging control circuit detects a maximum threshold output current of the charging power source, and charges the lithium-ion battery at the maximum threshold output current of the charging power source when the maximum threshold output current of the charging power source is smaller than a preset charging current value. When a charging current during the constant-voltage charge is decreased to a preset fully charged determination current, charging of the lithium-ion battery is stopped.

Control condition 3, when the charging power source is disconnected from the universal rechargeable battery, the lithium-ion battery charging/discharging control circuit detects the disconnection of the charging power source, and discharges remaining power stored in the filter capacitor during the charging, such that a voltage across the positive electrode and the negative electrode of the universal rechargeable battery drops rapidly to be equal to or lower than the maximum open circuit voltage and a discharging status is performed. During the discharging status, the lithium-ion battery charging/discharging control circuit cutoffs the charging and performs a regulated voltage discharge, and performs a regulated voltage output according to control condition 4.

Control condition 4, during the discharging status, the lithium-ion battery charging/discharging control circuit detects the output voltage of the lithium-ion battery, and performs a regulated voltage output by: decreasing the output voltage of the lithium-ion battery to a first output voltage when the output voltage of the lithium-ion battery is greater than a low power voltage $V_L$; decreasing the output voltage of the lithium-ion battery to a second output voltage when the output voltage of the lithium-ion battery is greater than a discharge cutoff voltage $V_D$ while equal to or lower than the low power voltage $V_L$, and restoring the output of the lithium-ion battery to the first voltage when the output voltage of the charged lithium-ion battery is greater than $V_L+\Delta V_1$, wherein $V_L$ is a low power voltage of the lithium-ion battery set by the voltage detection circuit based on the voltage/capacity characteristics of the lithium-ion battery for the universal rechargeable battery, $\Delta V_1$ is a backlash voltage of the lower power voltage detection threshold of the lithium-ion battery set by the voltage detection circuit, and $V_D$ is a discharge cutoff voltage of the lithium-ion battery set by the voltage detection circuit according to discharge characteristics of the lithium-ion battery for the universal rechargeable battery.

Control condition 5, during the discharging status, the lithium-ion battery charging/discharging control circuit detects the output voltage of the lithium-ion battery, and cutoffs the regulated voltage output when the output voltage of the lithium-ion battery drops to be equal to or lower than the discharge cutoff voltage $V_D$ and restores the regulated voltage output according to control condition 4 when the output voltage of the charged lithium-ion battery is greater than $V_D+\Delta V_2$, wherein $\Delta V_2$ is a backlash voltage of the discharge cutoff voltage detection threshold of the lithium-ion battery set by the voltage detection circuit.

Control condition 6, during the charging of the universal rechargeable battery, the lithium-ion battery charging/discharging control circuit detects the temperature of the lithium-ion battery, and cutoffs the charging of the lithium-ion battery when the temperature of the lithium-ion battery raises to a charging upper threshold temperature $T_{CH}$ and restores the charging of the lithium-ion battery when the temperature of the lithium-ion battery decreases to be lower than a temperature obtained by subtracting a backlash temperature form the charging upper threshold temperature, i.e., $T_{CH}-\Delta T_1$, wherein $T_{CH}$ is a charging upper threshold temperature of the lithium-ion battery set based on the charging technical specifications of the lithium-ion battery for the universal rechargeable battery, and $\Delta T_1$ is a backlash temperature corresponding to a backlash voltage of the $T_{CH}$ detection threshold set by a voltage detection circuit of the thermistor Rt.

Control condition 7, during the discharging of the universal rechargeable battery, the lithium-ion battery charging/discharging control circuit detects the temperature of the lithium-ion battery, and cutoffs the regulated voltage output when the temperature of the lithium-ion battery raises to a discharging upper threshold temperature $T_{DH}$ and restores the regulated voltage output when the temperature of the lithium-ion battery decreases to be lower than a temperature obtained by subtracting a backlash temperature form the discharging upper threshold temperature, i.e., $T_{DH}-\Delta T_2$, wherein $T_{DH}$ is a discharging upper threshold temperature of the lithium-ion battery set based on the discharging technical specifications of the lithium-ion battery for the universal rechargeable battery, and $\Delta T_2$ is a backlash temperature corresponding to a backlash voltage of the $T_{DH}$ detection threshold set by a voltage detection circuit of the thermistor Rt.

The lithium-ion battery is charged according to control condition 2 when control condition 1 determines that the charging power source is connected to the universal rechargeable battery and control condition 6 allows for the charging of the lithium-ion battery, and the charging of the lithium-ion battery is cutoff when control condition 6 prohibits the charging of the lithium-ion battery.

Output power of the lithium-ion battery is stepped-down and regulated output according to control condition 4 when control condition 3 determines that the universal rechargeable battery is disconnected from the charging power source and both control condition 5 and control condition 7 allow for the discharging output of the lithium-ion battery, and the lithium-ion battery charging/discharging control circuit cutoffs the regulated voltage output when either one of control condition 5 and control condition 7 prohibits the discharging output of the lithium-ion battery.

In one embodiment, the first output voltage of the universal rechargeable battery provided in the present disclosure may be any voltage value from 1.35V to 1.725V, the second output voltage may be any voltage value from 0.9V to 1.35V, and the maximum open circuit voltage may be any voltage value from 1.5V to 1.725V. Preferably, the first output voltage is 1.5V, the second output voltage is 1.1V, and the maximum open circuit voltage is 1.65V.

Referring to FIG. 54, the lithium-ion battery charging/discharging control circuit includes: a lithium-ion battery LIB, a monolithic integration rechargeable battery control chip U1, a negative temperature coefficient (NTC) thermistor Rt, a first resistor R1, a second resistor R2, a third resistor R3, a fourth resistor R4, a fifth resistor R5, a light emitting diode D1, a first capacitor C1, a second capacitor C2, and an inductor L1, wherein the monolithic integration rechargeable battery control chip U1, the light emitting diode D1, the third resistor R3, the fourth resistor R4, the first capacitor C1 and the second capacitor C2 constitute the lithium-ion battery charging control circuit, the monolithic integration rechargeable battery control chip U1, the first resistor R1, the second resistor R2, the fifth resistor R5 and the NTC thermistor Rt constitute the lithium-ion battery detection circuit, and the monolithic integration rechargeable battery control chip U1, the inductor L1, the first capacitor C1 and the second capacitor C2 constitute the DC-DC step-down regulator discharging circuit. The positive electrode of the lithium-ion battery LIB is connected to the node Jb+, and the negative electrode of the lithium-ion battery LIB is connected to the V− terminal of the lithium-ion battery charging/discharging control circuit. A charging power source connection lead VCC of the monolithic integration rechargeable battery control chip U1 is connected to the V+ terminal of the lithium-ion battery charging/discharging control circuit, a lithium-ion battery connection lead BAT of the monolithic integration rechargeable battery control chip U1 is connected to the cathode of the lithium-ion battery LIB, a power source grounding lead GND of the monolithic integration rechargeable battery control chip U1 is connected to the negative electrode of the lithium-ion battery LIB and the V− terminal of the lithium-ion battery charging/discharging control circuit, a charging status outputting lead LDD of the monolithic integration rechargeable battery control chip U1 is connected to a cathode of the light emitting diode D1, a temperature detection setting lead DTCS of the monolithic integration rechargeable battery control chip U1 is connected respectively to the first resistor R1 and the second resistor R2 at a node P1, a NTC voltage detection lead NTC of the monolithic integration rechargeable battery control chip U1 is connected respectively to the second resistor R2 and the NTC thermistor Rt at a voltage division node P2, a charging current setting lead IBSET of the monolithic integration rechargeable battery control chip U1 is connected to an end of the fourth resistor R4, a remaining power discharging lead DECO of the monolithic integration rechargeable battery control chip U1 is connected to an end of the fifth resistor R5, the discharging current setting lead IOSET of the monolithic integration rechargeable battery control chip U1 is connected to the lithium-ion battery connection lead BAT of the monolithic integration rechargeable battery control chip U1 or the power source grounding lead GND of the monolithic integration rechargeable battery control chip U1, and a modulated output lead SW of the monolithic integration rechargeable battery control chip U1 is connected to an end of the inductor L1. The NTC thermistor Rt is a NTC thermistor for sensing the temperature of the lithium-ion battery LIB, an end of the NTC thermistor Rt is connected to the second resistor R2 and the NTC voltage detection lead NTC of the monolithic integration rechargeable battery control chip U1 at the voltage division node P2, the other end thereof is connected to the power source grounding lead GND of the monolithic integration rechargeable battery control chip U1, and an insulation part of the body of the NTC thermistor Rt is attached to a thermal conductive circuit structure connected to the output electrode of the lithium-ion battery LIB. The first resistor R1 is an upper biasing voltage division resistor at the voltage division node P2, an end of the first resistor R1 is connected to the positive electrode of the lithium-ion battery LIB, and the other end thereof is connected to the second resistor R2 and the temperature detection setting lead DTCS of the monolithic integration rechargeable battery control chip U1 at the node P1. The second resistor R2 is an upper biasing voltage division resistor at the voltage division node P2, an end of the second resistor R2 is connected to the first resistor R1 and the temperature detection setting lead DTCS of the monolithic integration rechargeable battery control chip U1 at the node P1, and the other end thereof is connected to the NTC thermistor Rt and the NTC voltage detection lead NTC of the monolithic integration rechargeable battery control chip U1 at the voltage division node P2. The third resistor R3 is a current limiting resistor of the light emitting diode D1, an end of the third resistor R3 is connected to the V+ terminal of the lithium-ion battery charging/discharging control circuit, and the other end thereof is connected to the anode of the light emitting diode D1. The fourth resistor R4 is a charging current setting resistor of the monolithic integration rechargeable battery control chip U1, an end of the fourth resistor R4 is connected to the charging current setting lead IB SET of the monolithic integration rechargeable battery control chip U1, and the other end thereof is connected to the power source grounding lead GND of the monolithic integration rechargeable battery control chip U1. The fifth resistor R5 is a remaining power discharging current limiting resistor of the second capacitor C2, an end of the fifth resistor R5 is connected to the remaining power discharging lead DECO of the monolithic integration rechargeable battery control chip U1, and the other end thereof is connected to the positive electrode of the second capacitor C2. The light emitting diode D1 is a charging operation status indicting light emitting diode of the monolithic integration rechargeable battery control chip U1, the anode of the light emitting diode D1 is connected to the other end of the third resistor R3, and the cathode thereof is connected to the charging status outputting lead LDD of the monolithic integration rechargeable battery control chip U1. The first capacitor C1 is a charging output filter and discharging input filter and compensation capacitor of the monolithic integration rechargeable battery control chip U1, the positive electrode of the first capacitor C1 is connected to the lithium-ion battery connection lead BAT of the monolithic integration rechargeable battery control chip U1, and the negative electrode thereof is connected to the power source grounding lead GND of the monolithic integration rechargeable battery control chip U1. The second capacitor C2 is a charging input filter and discharging output filter and compensation capacitor of the monolithic integration rechargeable battery control chip U1, the positive electrode of the second capacitor C2 is connected to the other end of the inductor L1, the charging power source connection lead VCC of the monolithic integration rechargeable battery control chip U1 and the V+ terminal of the lithium-ion battery charging/discharging control circuit, and the negative electrode thereof is connected to the power source grounding lead GND of the monolithic integration rechargeable battery control chip U1. The inductor L1 is an output filter and compensation inductor of the monolithic integration rechargeable battery control chip U1, an end of the inductor L1 is connected to the modulated output lead SW of the monolithic integration rechargeable battery control chip U1, and the other end thereof is connected to the positive electrode of the second capacitor C2 and the V+ terminal of the lithium-ion battery charging/discharging control circuit. The monolithic integration rechargeable battery control chip U1 may be MGS4520A, MGS4520B or MGS4520C from ShenZhen Migison Electric Co., Ltd, having main control parameters as follows: input voltage 2.25V to 6V, charging upper threshold voltage $V_H$ (4.2V for MGS4520A, 3.65V for MGS4520B and 4.35V for MGS4520C), constant-current charging current ($I_{CHG}$) 500 mA, fully charged determination current $I_{CHG}/10$, NTC voltage detection threshold $0.3V_{LIB}$, discharge cutoff voltage $V_D$ (3.0V for MGS4520A, 2.5V for MGS4520B, and 3.0V for MGS4520C), discharging low power voltage $V_L$ (3.4V for MGS4520A, 3.1V for MGS4520B, and 3.4V for MGS4520C), remaining power discharging threshold 1.65V, steady state output voltage 1.5V (1.1V when $V_{LIB} \leq V_L$), and maximum steady state output current 2 A (1.0 A when $I_{OSET}$ lead is connected to GND).

Detailed control methods for each operation status of the lithium-ion battery charging/discharging control circuit are described as follows.

A method for controlling a switch of charging/discharging modes is provided. In a status where the universal rechargeable battery is not connected to the charging power source, a voltage of the charging power source connection lead VCC of the monolithic integration rechargeable battery control chip U1 is lower than 4V, the monolithic integration rechargeable battery control chip U1 cutoffs the charging and performs a regulated voltage output, and the universal rechargeable battery is in a regulated voltage output status. After the charging power source is connected, when the voltage of the charging power source connection lead VCC of the monolithic integration rechargeable battery control chip U1 is higher than 4V, the monolithic integration rechargeable battery control chip U1 cutoffs the regulated voltage output and performs the charging of the lithium-ion battery LIB, and the universal rechargeable battery is in a charging status until the charging power source is powered off when it is switched to discharging status and the discharge output is restored. In addition, when the universal rechargeable battery is switched from the charging status into the discharging status after the charging power source is disconnected, the remaining power discharging lead DECO of the monolithic integration rechargeable battery control chip U1 outputs a low level, and the remaining power charged in the second capacitor C2 during the charging is current limitedly discharged via the fifth resistor R5, such that the idle voltage of the universal rechargeable battery drops rapidly to the maximum open circuit voltage.

After the voltage of the second capacitor C2 drops to be equal to or lower than the maximum open circuit voltage, the output of the remaining power discharging lead DECO of the monolithic integration rechargeable battery control chip U1 switches to a high impedance state.

A control method for a charging process is provided. After the charging power source is connected to the universal rechargeable battery, the positive electrode of the charging power source is connected to the positive electrode V+ of the universal rechargeable battery, and the negative electrode of the charging power source is connected to the negative electrode V− of the universal rechargeable battery. As the positive electrode V+ of the universal rechargeable battery is a V+ terminal of the lithium-ion battery charging/discharging control circuit and the negative electrode V− of the universal rechargeable battery is the V− terminal of the lithium-ion battery charging/discharging control circuit, it corresponds to connecting the positive electrode of the charging power source to the charging power source connection lead VCC of the monolithic integration rechargeable battery control chip U1 and connecting the negative electrode of the charging power source to the power source grounding lead GND of the monolithic integration rechargeable battery control chip U1. At this time, if the temperature of the lithium-ion battery LIB is lower than $T_{CH}$, the monolithic integration rechargeable battery control chip U1 performs the charging of the lithium-ion battery LIB. The monolithic integration rechargeable battery control chip U1 detects the output voltage $V_{LIB}$ of the lithium-ion battery LIB via the lithium-ion battery connection lead BAT, and charges the lithium-ion battery LIB with the output of the lithium-ion battery connection lead BAT according to the status of $V_{LIB}$. When the output voltage $V_{LIB}$ of the lithium-ion battery LIB is equal to or smaller than the discharge cutoff voltage $V_D$ of the lithium-ion battery LIB ($V_{LIB} \leq V_D$), the monolithic integration rechargeable battery control chip U1 performs a trickling charge on the lithium-ion battery LIB, when the output voltage $V_{LIB}$ of the lithium-ion battery LIB is greater than the discharge cutoff voltage $V_D$ while smaller than the charging upper threshold voltage $V_H$ ($V_D < V_{LIB} < V_H$), the monolithic integration rechargeable battery control chip U1 performs a constant-current charge on the lithium-ion battery LIB with the current $I_{CHG}$, and when the output voltage $V_{LIB}$ of the lithium-ion battery LIB is equal to the charging upper threshold voltage $V_H$ ($V_{LIB} = V_H$), the monolithic integration rechargeable battery control chip U1 performs a constant-voltage charge on the lithium-ion battery LIB with the charging upper threshold voltage $V_H$ until the charging is stopped when the charging current reduces to $I_{CHG}/10$. During the charging, the light emitting diode D1 is powered with the charging power source, and is driven by the monolithic integration rechargeable battery control chip U1 via the charging status outputting lead LDD to display the operation status of the charging process.

A method for controlling the charging current is provided. A maximum charging current of the constant current status for charging the lithium-ion battery LIB from the monolithic integration rechargeable battery control chip U1 is set using a resistance value of the fourth resistor R4, i.e., $R4=1000V/I_{CHG}$ (wherein $I_{CHG}$ is a maximum charging current output from the monolithic integration rechargeable battery control chip U1 in a constant-current charging status), and the lithium-ion battery LIB fully charged determination current of the monolithic integration rechargeable battery control chip U1 is $I_{CHG}/10$.

A method for adaptively controlling the output current of the charging power source is provided. The monolithic integration rechargeable battery control chip U1 detects magnitude value of the voltage drop between an output voltage of the charging power source in the idle status and an output voltage of the charging power source in the linearly loaded status via the charging power source connection lead VCC, and determines the maximum allowed output current of the charging power source. When the maximum allowed output current of the charging power source is smaller than the current $I_{CHG}$, the monolithic integration rechargeable battery control chip U1 charges the lithium-ion battery LIB with the maximum allowed output current of the charging power source as the current limitation.

A method for controlling the regulated voltage output is provided. In a discharging status where the universal rechargeable battery is not connected to the charging power source, the monolithic integration rechargeable battery control chip U1 detects the output voltage $V_{LIB}$ of the lithium-ion battery LIB via the lithium-ion battery connection lead BAT. When the output voltage $V_{LIB}$ of the lithium-ion battery LIB is greater than the low power voltage ($V_{LIB} > V_L$), the monolithic integration rechargeable battery control chip U1 steps down the output voltage $V_{LIB}$ of the lithium-ion battery LIB to 1.5V for a regulated voltage output. When the output voltage $V_{LIB}$ of the lithium-ion battery LIB is equal to or lower than the low power voltage ($V_{LIB} \leq V_L$), the monolithic integration rechargeable battery control chip U1 steps down the output voltage $V_{LIB}$ of the lithium-ion battery LIB to 1.1V for a regulated voltage output. A determination value of the monolithic integration rechargeable battery control chip U1 for the detection of the low power voltage $V_L$ of the lithium-ion battery LIB is a multi-point sampling average value having a sampling frequency proportional to an output voltage change ratio of the lithium-ion battery LIB. The backlash voltage of the detection threshold is $\Delta V_1$, thus the monolithic integration rechargeable battery control chip U1 restores the regulated voltage output of 1.5V after the voltage $V_{LIB}$ of the charged lithium-ion battery LIB is raised to be equal to or greater than $V_L + \Delta V_1$.

A method for overdischarge protection is provided. In a discharging status where the universal rechargeable battery is not connected to the charging power source, the monolithic integration rechargeable battery control chip U1 detects the output voltage $V_{LIB}$ of the lithium-ion battery LIB via the lithium-ion battery connection lead BAT. When the output voltage $V_{LIB}$ of the lithium-ion battery LIB is greater than the discharge cutoff voltage ($V_{LIB} > V_D$), the monolithic integration rechargeable battery control chip U1 performs the regulated voltage output. When the output voltage $V_{LIB}$ of the lithium-ion battery LIB is equal to or smaller than the discharge cutoff voltage ($V_{LIB} \leq V_D$), the monolithic integration rechargeable battery control chip U1 cutoffs the regulated voltage output. A determination value of the monolithic integration rechargeable battery control chip U1 for the detection of the discharge cutoff voltage $V_D$ of the lithium-ion battery LIB is a multi-point sampling average value having a sampling frequency proportional to an output voltage change ratio of the lithium-ion battery LIB. The backlash voltage of the detection threshold is $\Delta V_2$, thus the monolithic integration rechargeable battery control chip U1 restores the regulated voltage output after the output voltage $V_{LIB}$ of the charged lithium-ion battery LIB is raised to be equal to or greater than $V_D + \Delta V_2$.

A control for controlling output overload or short circuit is provided. The monolithic integration rechargeable battery control chip U1 is configured with an output overload protection circuit having a settable current limitation. When the universal rechargeable battery is overloaded or short circuited, the monolithic integration rechargeable battery control chip U1 performs a regulated voltage output with a current limitation at a preset maximum output current $I_{LIM}$. The current limitation for the regulated voltage output of the monolithic integration rechargeable battery control chip U1 is set according to the input level of the discharging current setting lead $I_{OSET}$ of the monolithic integration rechargeable battery control chip U1. When the discharging current setting lead $I_{OSET}$ of the monolithic integration rechargeable battery control chip U1 is connected to the lithium-ion battery connection lead BAT of the monolithic integration rechargeable battery control chip U1, the monolithic integration rechargeable battery control chip U1 has a maximum output current $I_{LIM}$ of 2 A. When the discharging current setting lead $I_{OSET}$ of the monolithic integration rechargeable battery control chip U1 is connected to the power source grounding lead GND of the monolithic integration rechargeable battery control chip U1, the monolithic integration rechargeable battery control chip U1 has a maximum output current $I_{LIM}$ of 1 A. The maximum output current $I_{LIM}$ of the monolithic integration rechargeable battery control chip U1 is configured according to the discharging rate characteristics of the lithium-ion battery for the universal rechargeable battery, thereby preventing an over-rate discharging damage to the lithium-ion battery LIB when the universal rechargeable battery is overloaded or shout circuited.

A method for controlling charging overheat protection is provided. The NTC voltage detection lead NTC of the monolithic integration rechargeable battery control chip U1 has a threshold voltage of $0.3V_{LIB}$. During the charging status, the temperature detection setting lead DTCS of the monolithic integration rechargeable battery control chip U1 has an output of high impedance state, and the resistance values of the first resistor R1, the second resistor R2 and the NTC thermistor Rt are required to satisfy: 2.33Rtch=R1+R2 (wherein Rtch is a resistance value of the NTC thermistor Rt when the lithium-ion battery has a temperature equal to $T_{CH}$). When the operating temperature of the lithium-ion battery LIB is lower than the preset charging upper threshold temperature $T_{CH}$, the NTC voltage detection lead NTC of the monolithic integration rechargeable battery control chip U1 has a voltage higher than $0.3V_{LIB}$, and the monolithic integration rechargeable battery control chip U1 performs the charging of the lithium-ion battery LIB. When the operating temperature of the lithium-ion battery LIB raises to be equal to or greater than the charging upper threshold temperature $T_{CH}$, the NTC voltage detection lead NTC of the monolithic integration rechargeable battery control chip U1 has a voltage equal to or lower than $0.3V_{LIB}$, and the monolithic integration rechargeable battery control chip U1 cutoffs the charging of the lithium-ion battery LIB. A backlash voltage of the NTC voltage detection threshold of the monolithic integration rechargeable battery control chip U1 is $\Delta V_T$, and thus when the operating temperature of the lithium-ion battery LIB decreases such that the NTC voltage detection lead NTC of the monolithic integration rechargeable battery control chip U1 has a voltage equal to or lower than $0.3V_{LIB}+\Delta V_T$, the monolithic integration rechargeable battery control chip U1 restores the charging of the lithium-ion battery LIB.

A method for controlling discharging overheat protection is provided. The NTC voltage detection lead NTC of the monolithic integration rechargeable battery control chip U1 has a threshold voltage of $0.3V_{LIB}$. During the discharging status, the monolithic integration rechargeable battery control chip U1 connects the temperature detection setting lead DTCS to the lithium-ion battery connection lead BAT of the monolithic integration rechargeable battery control chip U1, and the resistance values of the second resistor R2 and the NTC thermistor Rt are required to satisfy: 2.33Rtdh=R2 (wherein Rtdh is a resistance value of the NTC thermistor Rt when the lithium-ion battery has a temperature equal to $T_{DH}$). When the operating temperature of the lithium-ion battery LIB is lower than the discharging upper threshold temperature $T_{DH}$, the NTC voltage detection lead NTC of the monolithic integration rechargeable battery control chip U1 has a voltage higher than $0.3V_{LIB}$, and the monolithic integration rechargeable battery control chip U1 performs the regulated voltage output. When the operating temperature of the lithium-ion battery LIB raises to be equal to or greater than the discharging upper threshold temperature $T_{DH}$, the NTC voltage detection lead NTC of the monolithic integration rechargeable battery control chip U1 has a voltage equal to or lower than $0.3V_{LIB}$, and the monolithic integration rechargeable battery control chip U1 cutoffs the regulated voltage output. A backlash voltage of the NTC voltage detection threshold of the monolithic integration rechargeable battery control chip U1 is $\Delta V_T$, and thus when the lithium-ion battery LIB stops discharging and the operating temperature of the lithium-ion battery LIB decreases such that the NTC voltage detection lead NTC of the monolithic integration rechargeable battery control chip U1 has a voltage equal to or lower than $0.3V_{LIB}+\Delta V_T$, the monolithic integration rechargeable battery control chip U1 restores the regulated voltage output.

A constructing method and a circuit connecting method of the constituted universal rechargeable batteries of the R6 rechargeable battery 500, the R03 rechargeable battery 700, the R1 rechargeable battery 800 and the R8D425 rechargeable battery 900, under the corresponding shaping structural technical standards and the structural technical specifications of the charging/discharging controller, are described as follows.

(I) The R6 rechargeable battery 500 constituted by employing the negative electrode outer housing packaging lithium-ion battery unit 510 is provided.

Referring to FIGS. 1 to 6, the R6 rechargeable battery 500 includes: an outer packaging housing 502; and a charging/discharging controller 550, a lithium-ion battery 510, and a negative electrode end cap 503 packaged in the outer packaging housing 502. At a positive electrode end of the R6 rechargeable battery 500, a protrusion structure of the positive electrode end cap 501 exposed outside the outer packaging housing 502 is used as the positive electrode of the R6 rechargeable battery 500. A light transmitting flange structure of the charging/discharging controller support frame 552 formed of light transmitting insulation material between the positive electrode end cap 501 and the outer packaging housing 502 is used as a light emitting display for the charging operating status of the R6 rechargeable battery 500. At a negative electrode end of the R6 rechargeable battery 500, a protrusion structure of the negative electrode end cap 503 exposed outside the outer packaging housing 502 is used as the negative electrode of the R6 rechargeable battery 500.

In the R6 rechargeable battery 500, under the structural technical standards of the R6 battery and the structural technical specifications of the charging/discharging controller 550, a constructing method and a circuit connecting method of the R6 rechargeable battery 500 constituted by employing the negative electrode outer housing packaging lithium-ion battery unit 510 are described as follows.

Figure 3:
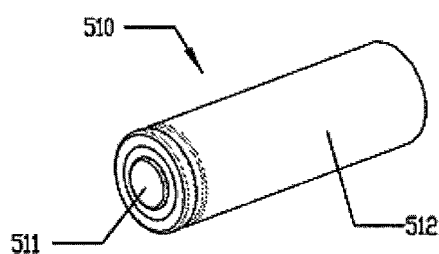
FIG. 3 is a structural schematic diagram of a positive electrode end of a negative electrode outer housing packaging rechargeable battery unit for a R6 rechargeable battery constituted by employing lithium-ion battery.
Figure 4:
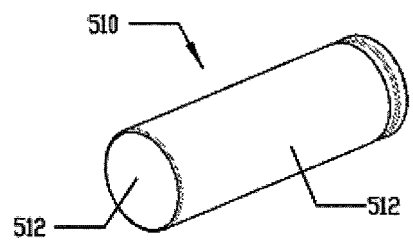
FIG. 4 is a structural schematic diagram of a negative electrode end of a negative electrode outer housing packaging rechargeable battery unit for a R6 rechargeable battery constituted by employing lithium-ion battery.
Figure 5:
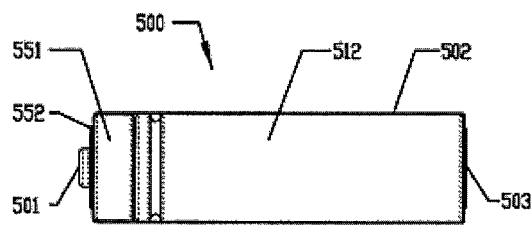
FIG. 5 is an inner assembly structural schematic cross sectional diagram taken along an axis of the outer packaging housing of the assembled R6 rechargeable battery constituted by employing negative electrode outer housing packaging rechargeable battery unit.
Figure 6:
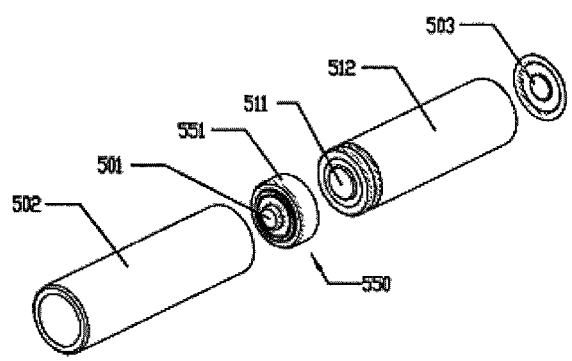
FIG. 6 is an exploded structural schematic diagram of the assembled R6 rechargeable battery constituted by employing negative electrode outer housing packaging rechargeable battery unit.
Figure 7:
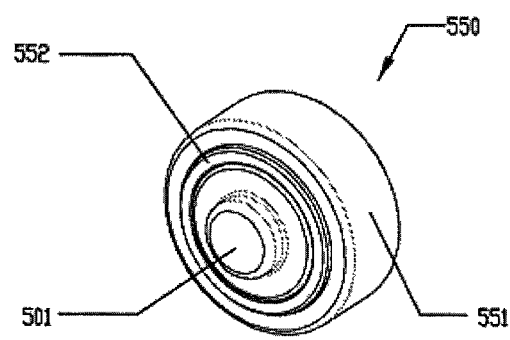
FIG. 7 is a structural schematic diagram of an end at a positive electrode end cap side of the charging/discharging controller for the R6 rechargeable battery.
Figure 8:
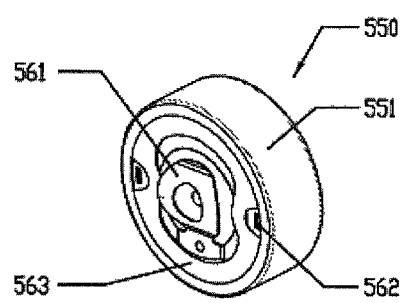
FIG. 8 is a structural schematic diagram of an end in connection with the positive electrode of the lithium-ion battery of the charging/discharging controller for the R6 rechargeable battery.
Figure 9:
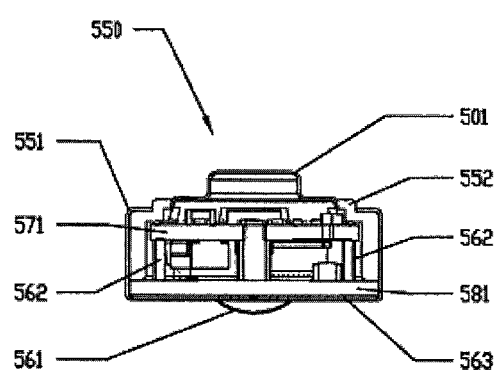
FIG. 9 is an inner assembly structural schematic cross sectional diagram taken along an axis of the charging/discharging controller housing, charging/discharging controller support frame and the positive electrode end cap of the assembled charging/discharging controller for the R6 rechargeable battery.
Figure 10:
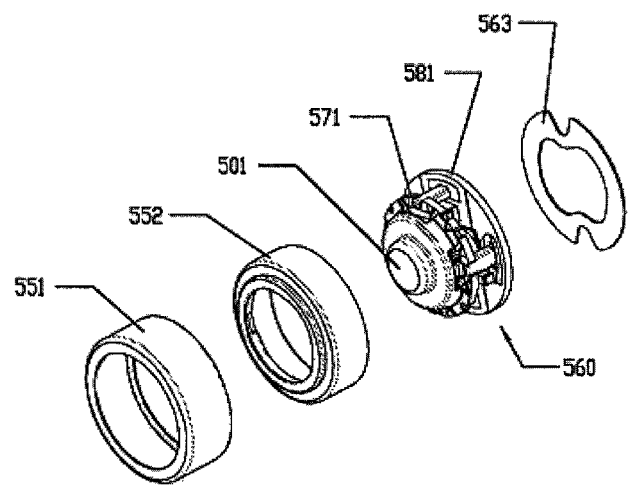
FIG. 10 is an exploded structural schematic diagram of the assembled charging/discharging controller for the R6 rechargeable battery.
Figure 11:
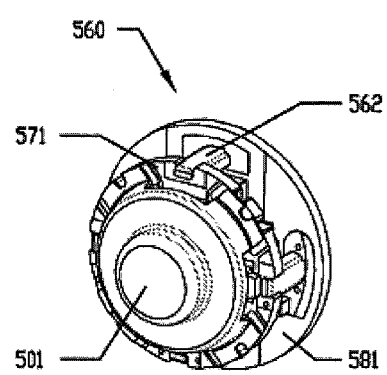
FIG. 11 is a structural schematic diagram of an end of a PCB solder body at the positive electrode end cap side in the charging/discharging controller for the R6 rechargeable battery.
Figure 12:
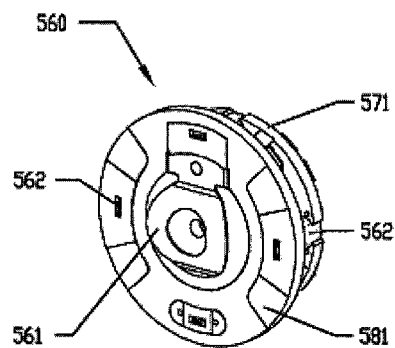
FIG. 12 is a structural schematic diagram of an end of the PCB solder body in connection with the positive electrode of the lithium-ion battery in the charging/discharging controller for the R6 rechargeable battery.
Figure 13:
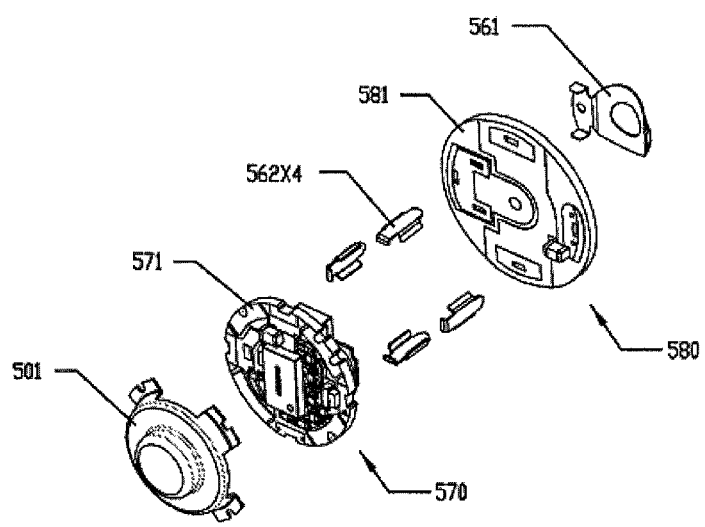
FIG. 13 is an exploded structural schematic diagram of the PCB solder body in the charging/discharging controller for the R6 rechargeable battery.
Figure 14:
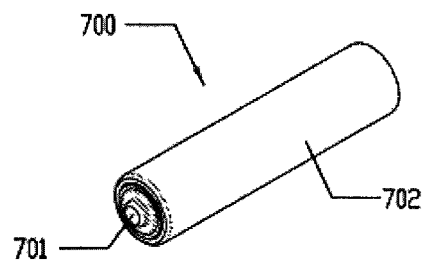
FIG. 14 is a structural schematic diagram of a positive electrode end of the assembled rechargeable battery of a R03 rechargeable battery constituted by employing lithium-ion battery.
Figure 15:
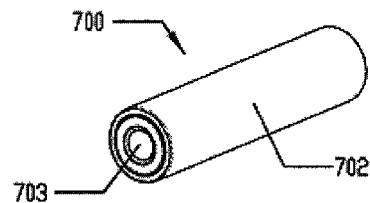
FIG. 15 is a structural schematic diagram of a negative electrode end of the assembled rechargeable battery of a R03 rechargeable battery constituted by employing lithium-ion battery.

Referring to FIGS. 3 and 4, a circular outer housing and a bottom end of the negative electrode outer housing packaging lithium-ion battery unit 510 are the negative electrode 512 of the lithium-ion battery unit 510, and a protrusion cap at the other end is the positive electrode 511 of the lithium-ion battery unit 510. The negative electrode outer housing packaging lithium-ion battery unit 510 is a lithium-ion battery employing an outer housing packaged using a steel outer housing or other conductive outer housing as the negative electrode. In the present embodiment, for primarily improving the power capacity of the universal rechargeable battery, a 920 mAh high power R14430 lithium cobalt oxide battery employing a steel housing packaging is used as the negative electrode outer housing packaging lithium-ion battery unit 510.

Referring to FIG. 54, in the present embodiment, the monolithic integration rechargeable battery control chip U1 for the lithium-ion battery charging/discharging control circuit is MGS4520C having main control parameters as follows: charging input voltage 4V to 6V, charging upper threshold voltage ($V_H$) 4.35V, maximum charging output current 500 mA ($I_{CHG}$), fully charged determination current $I_{CHG}$/10, discharging low power voltage 3.4V ($V_L$), discharge cutoff voltage 3.0V ($V_D$), and maximum steady state output current 2A (wherein discharging current setting lead $I_{OSET}$ of the monolithic integration rechargeable battery control chip U1 is connected to the lithium-ion battery connection lead BAT of the monolithic integration rechargeable battery control chip U1). On such basis, the R6 rechargeable battery of the present embodiment may have control parameters mainly including: charging input voltage 5V±0.7V, maximum charging current ($I_{CHG}$) designed to be 370 mA (wherein maximum charging rate of the lithium-ion battery LIB is about 0.4 C), charging upper threshold temperature $T_{CH}$ of the lithium-ion battery LIB designed to be 45° C., discharging upper threshold temperature $T_{DH}$ of the lithium-ion battery LIB designed to be 55° C., regulated voltage output voltage 1.5V, low power regulated voltage output voltage 1.1V, maximum regulated voltage output current 2 A (wherein maximum discharging rate of the lithium-ion battery LIB is about 1 C), and power capacitance approaching 220 mAh.

Referring to FIGS. 1 to 6 and FIG. 54, in the present embodiment, the lithium-ion battery LIB is the negative electrode outer housing packaging lithium-ion battery unit 510, the positive electrode 511 of the lithium-ion battery unit 510 is the positive electrode of the lithium-ion battery LIB, and the negative electrode 512 of the lithium-ion battery unit 510 is the negative electrode of the lithium-ion battery LIB. The assembling process for assembling the R6 rechargeable battery 500 employing the negative electrode outer housing packaging lithium-ion battery unit 510 may be performed directly by referring to the above assembling process, and the heat dissipation principles are the same, which are not repeated herein.

Referring to FIGS. 7 to 13 and FIG. 54, the assembling process for assembling the charging/discharging controller 550 for the R6 rechargeable battery 500 may be performed directly by referring to the above assembling process, which is not repeated herein. The assembled circuit has a connecting relation as follows.

Referring to FIGS. 1 to 13 and FIG. 54, the assembled R6 rechargeable battery 500 constituted by employing the negative electrode outer housing packaging lithium-ion battery unit 510 has a circuit connecting relation as follows: the positive electrode end cap 501 soldered at the V+ terminal in FIG. 54 is used as the positive electrode for the discharging output and charging input of the R6 rechargeable battery 500; the positive electrode 511 of the lithium-ion battery unit 510 is elastically crimped with the positive electrode crimping piece soldered at the node Jb+ in FIG. 54, which in circuit connection sense equals to connecting the positive electrode 511 of the lithium-ion battery unit 510 to the node Jb+ in FIG. 54; and a circuit connection is established by crimping the charging/discharging controller housing 551 soldered at the V− terminal in FIG. 54 and the negative electrode end cap 503 soldered at the negative electrode 512 of the lithium-ion battery unit 510 via the outer packaging housing 502, which in circuit connection sense equals to connecting the negative electrode 512 of the lithium-ion battery unit 510 to the V− terminal in FIG. 54 via the negative electrode end cap 503, the outer packaging housing 502 of the rechargeable battery and the charging/discharging controller housing 551, such that the negative electrode end cap 503 becomes the negative electrode for discharging output and charging input of the R6 rechargeable battery 500.

(II) The R03 rechargeable battery 700 constituted by employing the positive electrode outer housing packaging lithium-ion battery unit 720 is provided.

In the R03 rechargeable battery 700, under the structural technical standards of the R03 battery and the structural technical specifications of the charging/discharging controller 750, a constructing method and a circuit connecting method of the R03 rechargeable battery 700 constituted by employing the negative electrode outer housing packaging lithium-ion battery unit 720 are described as follows.

Referring to FIGS. 14 to 19, the R03 rechargeable battery 700 includes: an outer packaging housing 702; and a charging/discharging controller 750, a positive electrode outer housing packaging lithium-ion battery unit 720, and a negative electrode end cap 703 packaged in the outer packaging housing 702. At a positive electrode end of the R03 rechargeable battery 700, a protrusion structure of the positive electrode end cap 701 exposed outside the outer packaging housing 702 is used as the positive electrode of the R03 rechargeable battery 700. A light transmitting flange structure of the charging/discharging controller support frame 752 formed of light transmitting insulation material between the positive electrode end cap 701 and the outer packaging housing 702 is used as a light emitting display for the charging operating status of the R03 rechargeable battery 700. At a negative electrode end of the R03 rechargeable battery 700, a protrusion structure of the negative electrode end cap 703 exposed outside the outer packaging housing 702 is used as the negative electrode of the R03 rechargeable battery 700.

Figure 16:
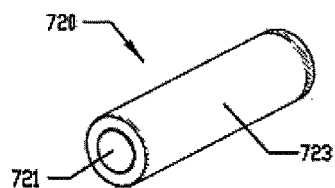
FIG. 16 is a structural schematic diagram of a positive electrode end of a positive electrode outer housing packaging rechargeable battery unit for a R03 rechargeable battery constituted by employing lithium-ion battery.
Figure 17:
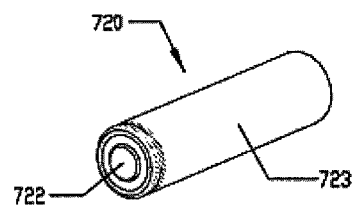
FIG. 17 is a structural schematic diagram of a negative electrode end of a positive electrode outer housing packaging rechargeable battery unit for a R03 rechargeable battery constituted by employing lithium-ion battery.
Figure 18:
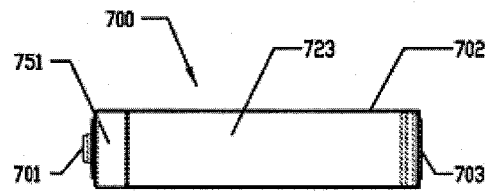
FIG. 18 is an inner assembly structural schematic cross sectional diagram taken along an axis of the outer packaging housing of the assembled R03 rechargeable battery constituted by employing positive electrode outer housing packaging rechargeable battery unit.
Figure 19:
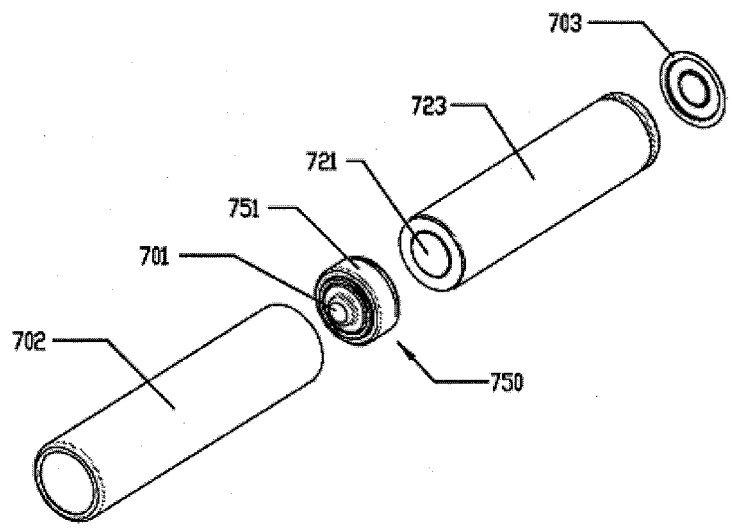
FIG. 19 is an exploded structural schematic diagram of the assembling relationship of the assembled R03 rechargeable battery constituted by employing positive electrode outer housing packaging rechargeable battery unit.
Figure 20:
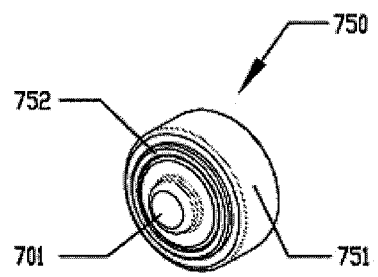
FIG. 20 is a structural schematic diagram of an end at a positive electrode end cap side of the charging/discharging controller for the R03 rechargeable battery.
Figure 21:
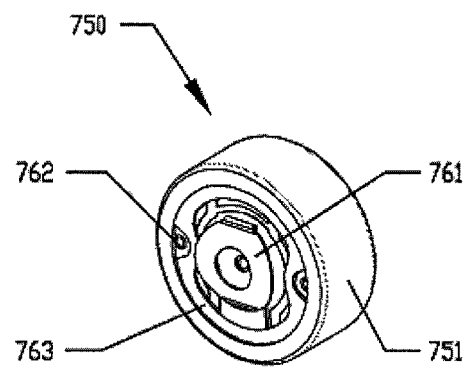
FIG. 21 is a structural schematic diagram of an end in connection with the positive electrode of the lithium-ion battery of the charging/discharging controller for the R03 rechargeable battery.
Figure 22:
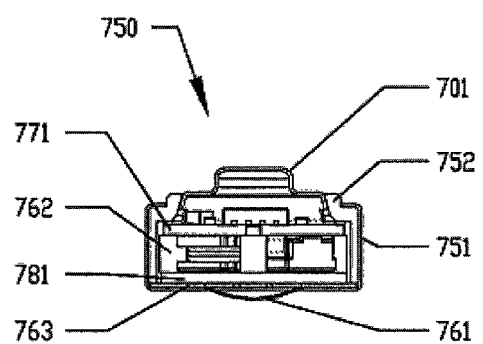
FIG. 22 is an inner assembly structural schematic cross sectional diagram taken along an axis of the charging/discharging controller housing, charging/discharging controller support frame and the positive electrode end cap of the assembled charging/discharging controller for the R03 rechargeable battery.
Figure 23:
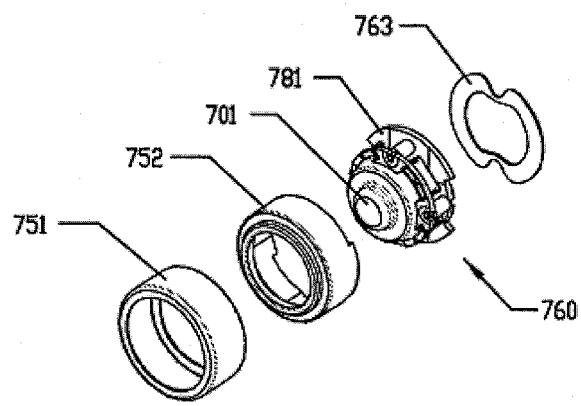
FIG. 23 is an exploded structural schematic diagram of the assembled charging/discharging controller for the R03 rechargeable battery.
Figure 24:
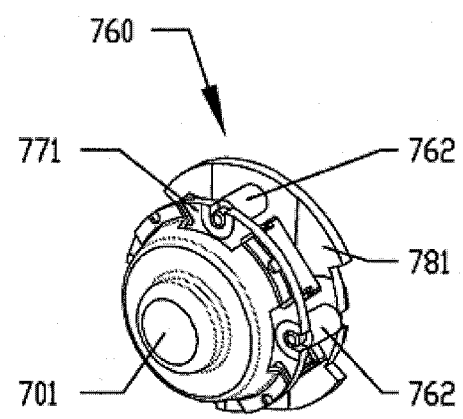
FIG. 24 is a structural schematic diagram of an end of a PCB solder body at the positive electrode end cap side in the charging/discharging controller for the R03 rechargeable battery.
Figure 25:
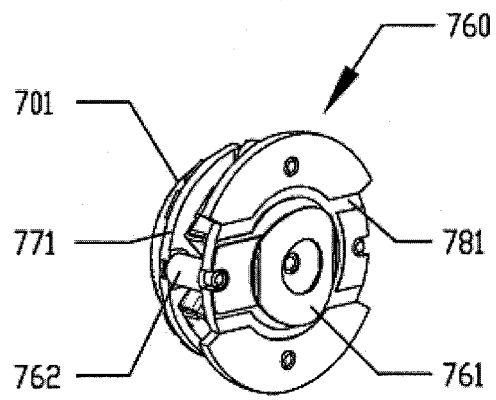
FIG. 25 is a structural schematic diagram of an end of the PCB solder body in connection with the positive electrode of the lithium-ion battery in the charging/discharging controller for the R03 rechargeable battery.
Figure 26:
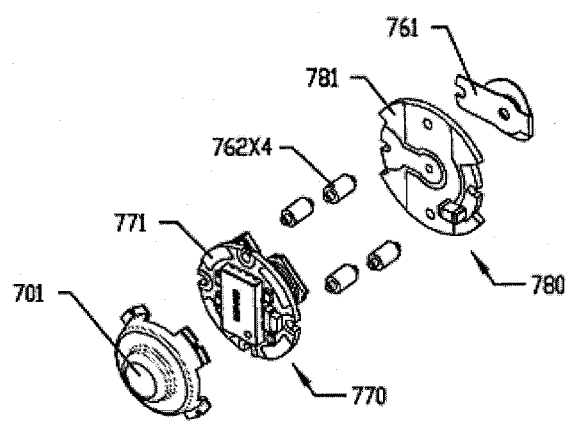
FIG. 26 is an exploded structural schematic diagram of the PCB solder body in the charging/discharging controller for the R03 rechargeable battery.
Figure 27:
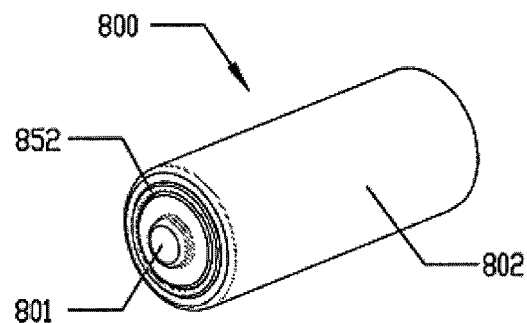
FIG. 27 is a structural schematic diagram of a positive electrode end of the assembled rechargeable battery of a R1 rechargeable battery constituted by employing lithium-ion battery.
Figure 28:
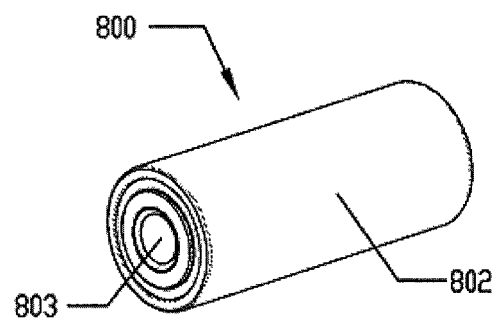
FIG. 28 is a structural schematic diagram of a negative electrode end of the assembled rechargeable battery of a R1 rechargeable battery constituted by employing lithium-ion battery.

Referring to FIGS. 16 and 17, a circular outer housing and a bottom end of the positive electrode outer housing packaging lithium-ion battery unit 720 are the positive electrode 721 of the lithium-ion battery 720, and a protrusion cap at the other end is the negative electrode 722 of the lithium-ion battery 720. A plastic insulating film 723 is thermoplastic-coated on the circular outer housing of the lithium-ion battery 720, and after the thermoplastic insulating film 723 covers the housing, only a portion of the outer housing exposed at the bottom is used as the positive electrode 721 of the lithium-ion battery 720. The positive electrode outer housing packaging lithium-ion battery unit 720 is a lithium-ion battery employing an outer housing packaged using an aluminum outer housing or other conductive outer housing as the positive electrode. In the present embodiment, for primarily improving the power capacity of the universal rechargeable battery, a 300 mAh R10380 lithium nickel cobalt manganese oxide battery employing an aluminum housing packaging is used as the positive electrode outer housing packaging lithium-ion battery unit 720.

Referring to FIG. 54, in the present embodiment, the monolithic integration rechargeable battery control chip U1 for the lithium-ion battery charging/discharging control circuit is MGS4520 A having main control parameters as follows: charging input voltage 4V to 6V, charging upper threshold voltage ($V_H$) 4.2V, maximum charging output current 500 mA ($I_{CHG}$), fully charged determination current $I_{CHG}/10$, discharging low power voltage 3.4V ($V_L$), discharge cutoff voltage 3.0V ($V_D$), and maximum steady state output current 1 A (wherein discharging current setting lead $I_{OSET}$ of the monolithic integration rechargeable battery control chip U1 is connected to the power source grounding lead GND of the monolithic integration rechargeable battery control chip U1). On such basis, the R03 rechargeable battery of the present embodiment may have control parameters mainly including: charging input voltage 5V±0.7V, maximum charging current ($I_{CHG}$) designed to be 150 mA (wherein maximum charging rate of the lithium-ion battery LIB is about 0.5 C), charging upper threshold temperature $T_{CH}$ of the lithium-ion battery LIB designed to be 45° C., discharging upper threshold temperature $T_{DH}$ of the lithium-ion battery LIB designed to be 55° C., regulated voltage output voltage 1.5V, low power regulated voltage output voltage 1.1V, maximum regulated voltage output current 1 A (wherein maximum discharging rate of the lithium-ion battery LIB is about 1.5 C), and power capacity approaching 700 mAh.

Referring to FIGS. 14 to 19 and FIG. 54, the lithium-ion battery LIB is the positive electrode outer housing packaging lithium-ion battery unit 720, the positive electrode 721 of the positive electrode outer housing packaging lithium-ion battery unit 720 is the positive electrode of the lithium-ion battery LIB, and the negative electrode 722 of the positive electrode outer housing packaging lithium-ion battery unit 720 is the negative electrode of the lithium-ion battery LIB. The assembling process for assembling the R03 rechargeable battery 700 employing the positive electrode outer housing packaging lithium-ion battery unit 720 may be performed directly by referring to the above assembling process, and the heat dissipation principles are the same, which are not repeated herein.

Referring to FIGS. 20 to 26 and FIG. 54, the assembling process for assembling the charging/discharging controller 750 for the R03 rechargeable battery 700 may be performed directly by referring to the above assembling process, which is not repeated herein. The assembled circuit has a connecting relation as follows.

Referring to FIGS. 14 to 26 and FIG. 54, the assembled R03 rechargeable battery 700 constituted by employing the positive electrode outer housing packaging lithium-ion battery unit 720 has a circuit connecting relation as follows: the positive electrode end cap 701 soldered at the V+ terminal in FIG. 54 is used as the positive electrode for the discharging output and charging input of the R03 rechargeable battery 700; the positive electrode 721 of the lithium-ion battery 720 is elastically crimped with the positive electrode crimping piece 761 soldered at the node Jb+ in FIG. 54, which in circuit connection sense equals to connecting the positive electrode 721 of the lithium-ion battery 720 to the node Jb+ in FIG. 54 via the positive electrode crimping piece 761; and a circuit connection is established by crimping the charging/discharging controller housing 751 soldered at the V− terminal in FIG. 54 and the negative electrode end cap 703 soldered at the negative electrode 722 of the lithium-ion battery 720 via the outer packaging housing 702, which in circuit connection sense equals to connecting the negative electrode 722 of the lithium-ion battery 720 to the V− terminal in FIG. 54 via the negative electrode end cap 703, the outer packaging housing 702 and the charging/discharging controller housing 751, such that the negative electrode end cap 703 becomes the negative electrode for discharging output and charging input of the R03 rechargeable battery 700.

(III) The R1 rechargeable battery 800 constituted by employing the negative electrode outer housing packaging lithium-ion battery unit 810 is provided.

In the R1 rechargeable battery 800, under the structural technical standards of the R1 battery and the structural technical specifications of the charging/discharging controller 850, a constructing method and a circuit connecting method of the R1 rechargeable battery 800 constituted by employing the negative electrode outer housing packaging lithium-ion battery unit 810 are described as follows.

Referring to FIGS. 27 to 32, the R1 rechargeable battery 800 includes: an outer packaging housing 802; and a charging/discharging controller 850, a negative electrode outer housing packaging lithium-ion battery unit 810, and a negative electrode end cap 803 packaged in the outer packaging housing 802. At a positive electrode end of the R1 rechargeable battery 800, a protrusion structure of the positive electrode end cap 801 exposed outside the outer packaging housing 802 is used as the positive electrode of the R1 rechargeable battery 800. A light transmitting flange structure of the charging/discharging controller support frame 852 formed of light transmitting insulation material between the positive electrode end cap 801 and the outer packaging housing 802 is used as a light emitting display for the operating status of the R1 rechargeable battery 800. At a negative electrode end of the R1 rechargeable battery 800, a protrusion structure of the negative electrode end cap 803 exposed outside the outer packaging housing 802 is used as the negative electrode of the R1 rechargeable battery 800.

Figure 29:
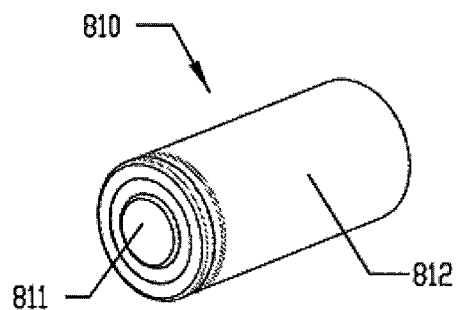
FIG. 29 is a structural schematic diagram of a positive electrode end of a negative electrode outer housing packaging rechargeable battery unit for a R1 rechargeable battery constituted by employing lithium-ion battery.
Figure 30:
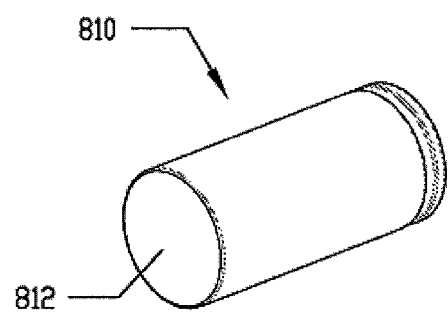
FIG. 30 is a structural schematic diagram of a negative electrode end of a negative electrode outer housing packaging rechargeable battery unit for a R1 rechargeable battery constituted by employing lithium-ion battery.
Figure 31:
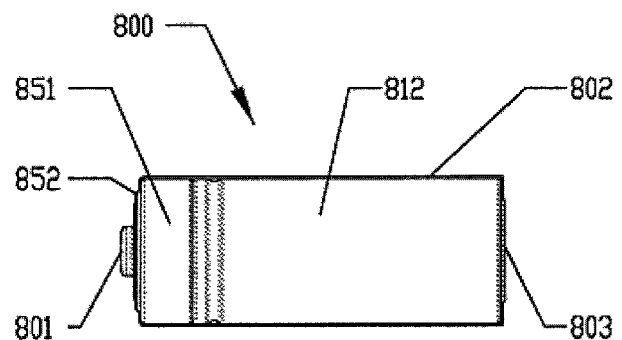
FIG. 31 is an inner assembly structural schematic cross sectional diagram taken along an axis of the outer packaging housing of the assembled R1 rechargeable battery constituted by employing negative electrode outer housing packaging rechargeable battery unit.
Figure 32:
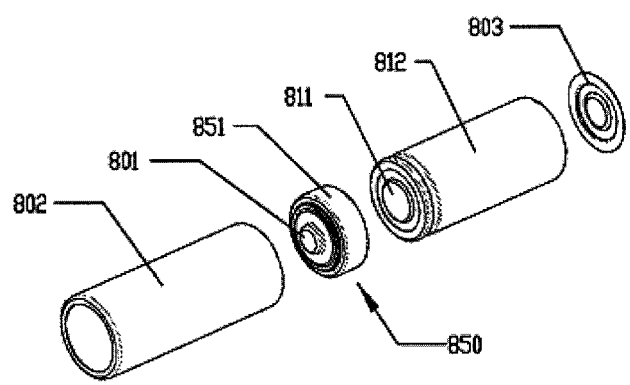
FIG. 32 is an exploded structural schematic diagram of the assembled R1 rechargeable battery constituted by employing negative electrode outer housing packaging rechargeable battery unit.
Figure 33:
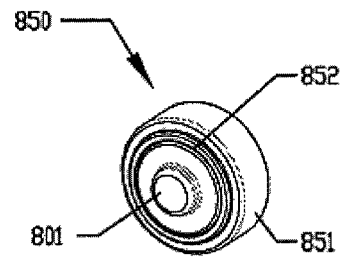
FIG. 33 is a structural schematic diagram of an end at a positive electrode end cap side of the charging/discharging controller for the R1 rechargeable battery.
Figure 34:
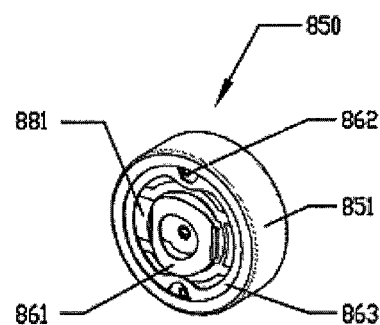
FIG. 34 is a structural schematic diagram of an end in connection with the positive electrode of the lithium-ion battery of the charging/discharging controller for the R1 rechargeable battery.
Figure 35:
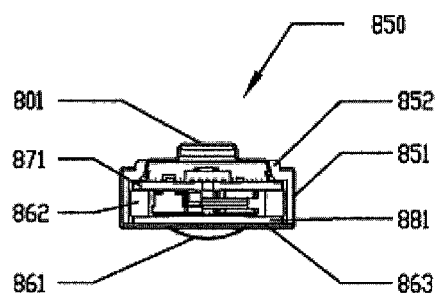
FIG. 35 is an inner assembly structural schematic cross sectional diagram taken along an axis of the charging/discharging controller housing, charging/discharging controller support frame and the positive electrode end cap of the assembled charging/discharging controller for the R1 rechargeable battery.
Figure 36:
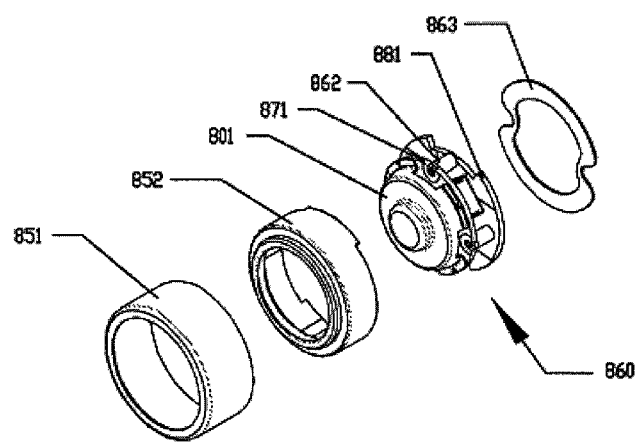
FIG. 36 is an exploded structural schematic diagram of the assembled charging/discharging controller for the R1 rechargeable battery.
Figure 37:
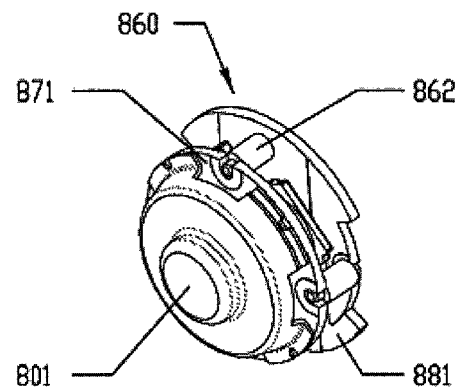
FIG. 37 is a structural schematic diagram of an end of a PCB solder body at the positive electrode end cap side in the charging/discharging controller for the R1 rechargeable battery.
Figure 38:
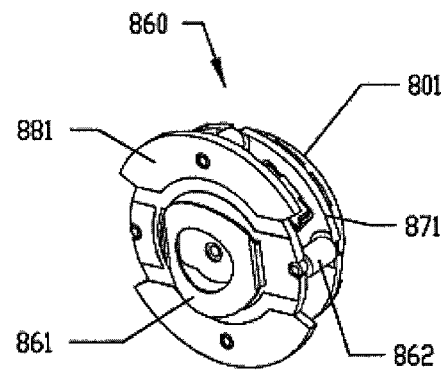
FIG. 38 is a structural schematic diagram of an end of the PCB solder body in connection with the positive electrode of the lithium-ion battery in the charging/discharging controller for the R1 rechargeable battery.
Figure 39:
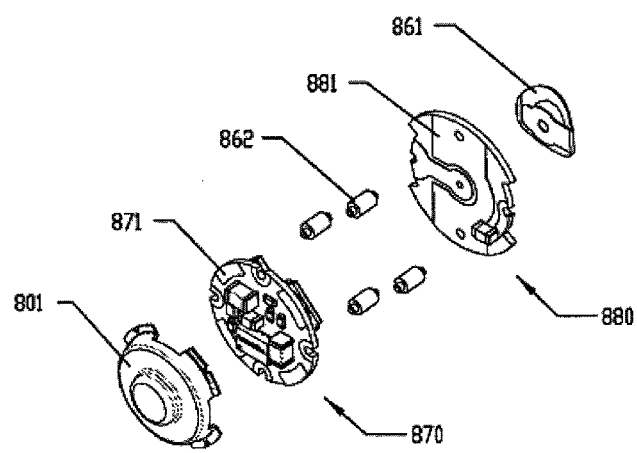
FIG. 39 is an exploded structural schematic diagram of the PCB solder body in the charging/discharging controller for the R1 rechargeable battery.
Figure 40:
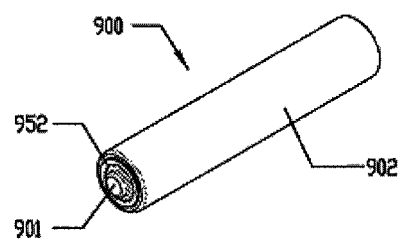
FIG. 40 is a structural schematic diagram of a positive electrode end of the assembled rechargeable battery of a R8D425 rechargeable battery constituted by employing lithium-ion battery.
Figure 41:
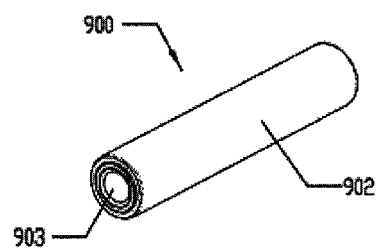
FIG. 41 is a structural schematic diagram of a negative electrode end of the assembled rechargeable battery of a R8D425 rechargeable battery constituted by employing lithium-ion battery.

Referring to FIGS. 29 and 30, a circular outer housing and a bottom end of the negative electrode outer housing packaging lithium-ion battery unit 810 is the negative electrode 812 of the lithium-ion battery 810, and a protrusion cap at the other end is the positive electrode 811 of the lithium-ion battery 810. The negative electrode outer housing packaging lithium-ion battery unit 810 is a lithium-ion battery employing an outer housing packaged using a steel outer housing or other conductive outer housing as the negative electrode. In the present embodiment, for primarily improving the power capacitance of the universal rechargeable battery, a 160 mAh R11250 lithium iron phosphate battery employing a steel housing packaging is used as the lithium-ion battery 810.

Referring to FIG. 54, in the present embodiment, the monolithic integration rechargeable battery control chip U1 for the lithium-ion battery charging/discharging control circuit is MGS4520B having main control parameters as follows: charging input voltage 4V to 6V, charging upper threshold voltage ($V_H$) 3.65V, maximum charging output current 500 mA ($I_{CHG}$), fully charged determination current $I_{CHG}/10$, discharging low power voltage 3.1V ($V_L$), discharging cutoff voltage 2.5V ($V_D$), and maximum stead state output current 1A (wherein discharging current setting lead $I_{OSET}$ of the monolithic integration rechargeable battery control chip U1 is connected to the power source grounding lead GND of the monolithic integration rechargeable battery control chip U1). On such basis, the R1 rechargeable battery of the present embodiment may have control parameters mainly include: charging input voltage 5V±0.7V, maximum charging current ($I_{CHG}$) designed to be 80 mA (wherein maximum charging rate of the lithium-ion battery LIB is about 0.5 C), charging upper threshold temperature $T_{CH}$ of the lithium-ion battery LIB designed to be 50° C., discharging upper threshold temperature $T_{DH}$ of the lithium-ion battery LIB designed to be 60° C., regulated voltage output voltage 1.5V, low power regulated voltage output voltage 1.1V, maximum regulated voltage output current 1 A (wherein maximum discharging rate of the lithium-ion battery LIB is about 3.2 C), and power capacitance approaching 340 mAh.

Referring to FIGS. 27 to 32 and FIG. 54, the lithium-ion battery LIB is constituted by the negative electrode outer housing packaging lithium-ion battery unit 810, the positive electrode 811 of the lithium-ion battery 810 is the positive electrode of the lithium-ion battery LIB, and the negative electrode 812 of the lithium-ion battery 810 is the negative electrode of the lithium-ion battery LIB. The assembling process for assembling the R1 rechargeable battery 800 employing the negative electrode outer housing packaging lithium-ion battery unit 810 and the heat dissipation principle thereof are the same as those of the R6 rechargeable battery 500 constituted by employing the negative electrode outer housing packaging lithium-ion battery unit 510, which are not repeated therein.

Referring to FIGS. 33 to 39 and FIG. 54, the assembling process for assembling the charging/discharging controller 850 for the R1 rechargeable battery 800 may be performed directly by referring to the above assembling process, which is not repeated therein. The assembled circuit has a connecting relation as follows.

Referring to FIGS. 27 to 39 and FIG. 54, the assembled the R1 rechargeable battery 800 constituted by employing the negative electrode outer housing packaging lithium-ion battery unit 810 has a circuit connecting relation including: the positive end cap 801 soldered at the V+ terminal in FIG. 54 is used as the positive electrode for the discharging output and charging input of the R1 rechargeable battery 800; the positive electrode 811 of the lithium-ion battery 810 is elastically crimped with the positive electrode crimping piece 861 soldered at the node Jb+ in FIG. 54, which in circuit connection sense equals to connecting the positive electrode 811 of the lithium-ion battery 810 to the node Jb+ in FIG. 54; and establishing a circuit connection by crimping the charging/discharging controller housing 851 soldered at the V− terminal in FIG. 54 and the negative electrode end cap 803 soldered at the negative electrode 812 of the lithium-ion battery 810 via the outer packaging housing 802, which in circuit connection sense equals to connecting the negative electrode 812 of the lithium-ion battery 810 to the V− terminal in FIG. 54 via the negative electrode end cap 803, the outer packaging housing 802 and the charging/discharging controller housing 851, such that the negative electrode end cap 803 becomes the negative electrode for discharging output and charging input of the R1 rechargeable battery 800.

(IV) The R8D425 rechargeable battery 900 constituted by employing the soft packaging lithium-ion battery unit 930.

In the R8D425 rechargeable battery 900, under the structural technical standards of the R8D425 battery and the structural technical specifications of the charging/discharging controller 950, a constructing method and a circuit connecting method of the R8D425 rechargeable battery 900 constituted by employing the soft packaging lithium-ion battery unit 930 are described as follows.

Referring to FIGS. 40 to 45, the R8D425 rechargeable battery 900 includes: an outer packaging housing 902; and a charging/discharging controller 950, a soft packaging lithium-ion battery unit 930, and a negative electrode end cap 903 packaged in the outer packaging housing 902. At a positive electrode end of the R8D425 rechargeable battery 900, a protrusion structure of the positive electrode end cap 901 exposed outside the outer packaging housing 902 is used as the positive electrode of the R8D425 rechargeable battery 900. A light transmitting flange structure of the charging/discharging controller support frame 952 formed of light transmitting insulation material between the positive electrode end cap 901 and the outer packaging housing 902 is used as a light emitting display for the charging operating status of the R8D425 rechargeable battery 900. At a negative electrode end of the R8D425 rechargeable battery 900, a protrusion structure of the negative electrode end cap 903 exposed outside the outer packaging housing 902 is used as the negative electrode of the R8D425 rechargeable battery 900.

Figure 42:
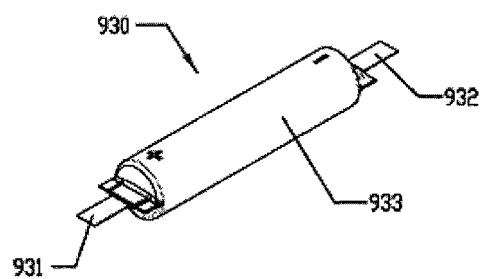
FIG. 42 is a structural schematic diagram of a positive electrode end of a soft packaging rechargeable battery unit for a R8D425 rechargeable battery constituted by employing lithium-ion battery.
Figure 43:
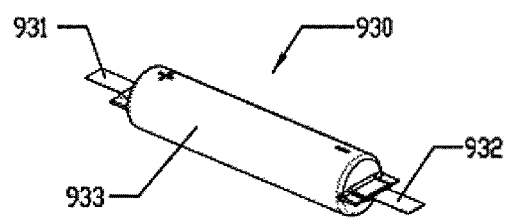
FIG. 43 is a structural schematic diagram of a negative electrode end of a soft packaging rechargeable battery unit for a R8D425 rechargeable battery constituted by employing lithium-ion battery.
Figure 44:
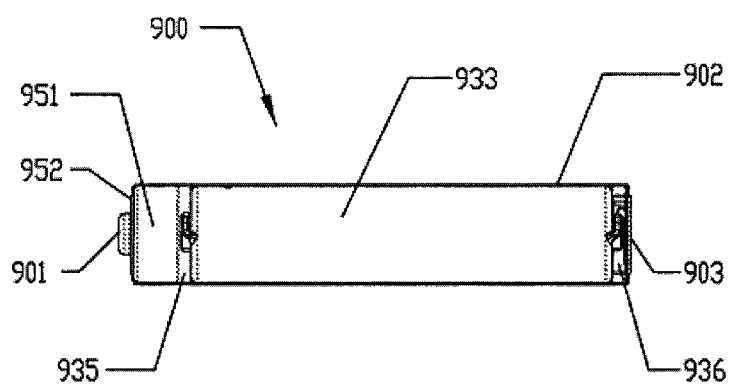
FIG. 44 is an inner assembly structural schematic cross sectional diagram taken along an axis of the outer packaging housing of the assembled R8D425 rechargeable battery constituted by employing soft packaging rechargeable battery unit.
Figure 45:
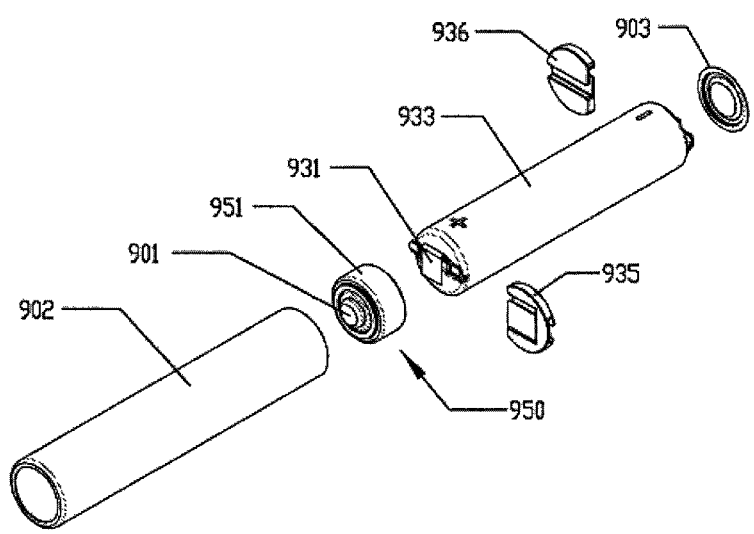
FIG. 45 is an exploded structural schematic diagram of the assembled R8D425 rechargeable battery constituted by employing soft packaging rechargeable battery unit.
Figure 46:
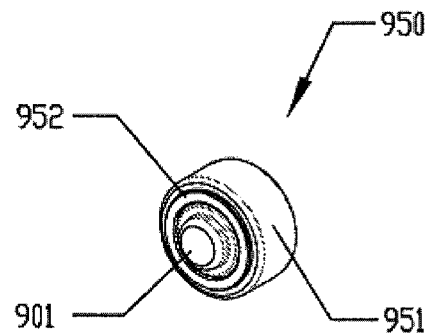
FIG. 46 is a structural schematic diagram of an end at a positive electrode end cap side of the charging/discharging controller for the R8D425 rechargeable battery.
Figure 47:
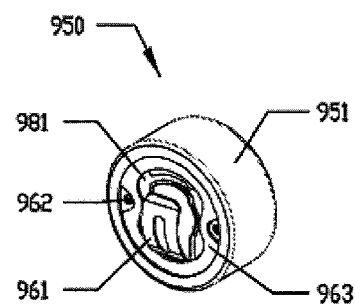
FIG. 47 is a structural schematic diagram of an end in connection with the positive electrode of the lithium-ion battery of the charging/discharging controller for the R8D425 rechargeable battery.
Figure 48:
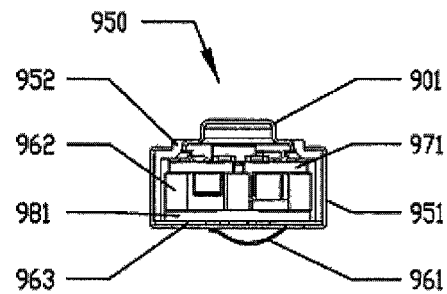
FIG. 48 is an inner assembly structural schematic cross sectional diagram taken along an axis of the charging/discharging controller housing, charging/discharging controller support frame and the positive electrode end cap of the assembled charging/discharging controller for the R8D425 rechargeable battery.
Figure 49:
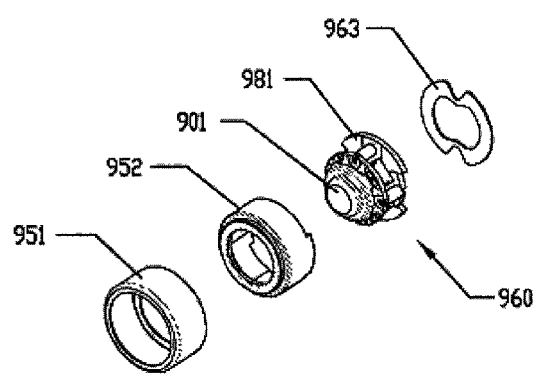
FIG. 49 is an exploded structural schematic diagram of the assembled charging/discharging controller for the R8D425 rechargeable battery.
Figure 50:
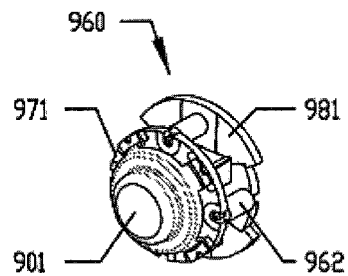
FIG. 50 is a structural schematic diagram of an end of a PCB solder body at the positive electrode end cap side in the charging/discharging controller for the R8D425 rechargeable battery.
Figure 51:
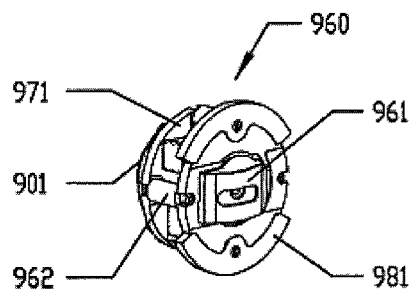
FIG. 51 is a structural schematic diagram of an end of the PCB solder body in connection with the positive electrode of the lithium-ion battery in the charging/discharging controller for the R8D425 rechargeable battery.
Figure 52:
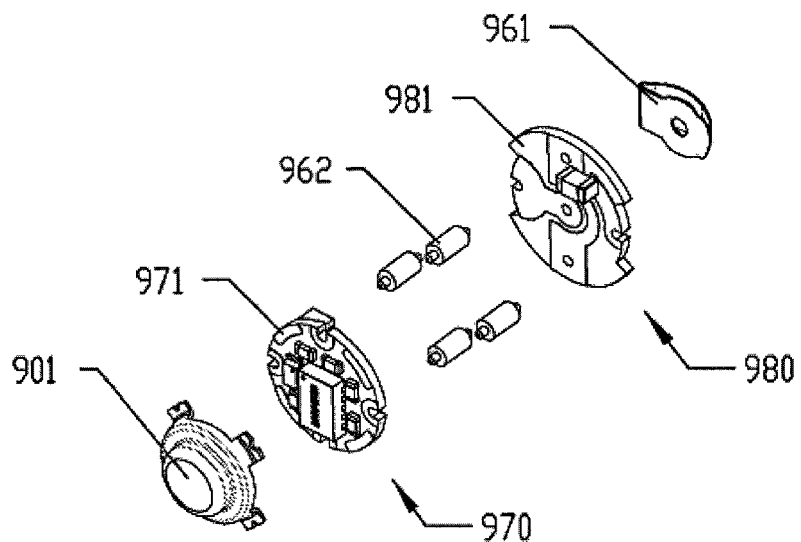
FIG. 52 is an exploded structural schematic diagram of the PCB solder body in the charging/discharging controller for the R8D425 rechargeable battery.

Referring to FIGS. 42 and 43, an end of the soft packaging lithium-ion battery unit 930 is the positive electrode 931 of the lithium-ion battery 930, and the other end is the negative electrode 932 of the lithium-ion battery 930. The soft packaging lithium-ion battery unit 930 is a soft packaging lithium-ion battery unit formed by employing aluminum-plastic composite film 933 or other material. In the present embodiment, for primarily improving the power capacity of the universal rechargeable battery, a 190 mAh R08350 general lithium cobalt oxide battery employing an aluminum-plastic film soft packaging is used as the lithium-ion battery 930.

Referring to FIG. 54, in the present embodiment, the monolithic integration rechargeable battery control chip U1 for the lithium-ion battery charging/discharging control circuit is MGS4520 A having main control parameters as follows: charging input voltage 4V to 6V, charging upper threshold voltage ($V_H$) 4.2V, maximum charging output current 500 mA ($I_{CHG}$), fully charged determination current $I_{CHG}/10$, discharging low power voltage 3.4V ($V_L$), discharge cutoff voltage 3.0V ($V_D$), and maximum steady state output current 1 A (wherein discharging current setting lead $I_{OSET}$ of the monolithic integration rechargeable battery control chip U1 is connected to the power source grounding lead GND of the monolithic integration rechargeable battery control chip U1). On such basis, the R8D425 rechargeable battery of the present embodiment may have control parameters mainly including: charging input voltage 5V±0.7V, maximum charging current ($I_{CHG}$) designed to be 100 mA (wherein maximum charging rate of the lithium-ion battery LIB is about 0.5 C), charging upper threshold temperature $T_{CH}$ of the lithium-ion battery LIB designed to be 45° C., discharging upper threshold temperature $T_{DH}$ of the lithium-ion battery LIB designed to be 55° C., regulated voltage output voltage 1.5V, low power regulated voltage output voltage 1.1V, maximum regulated voltage output current 1 A (wherein maximum discharging rate of the lithium-ion battery LIB is about 2.2 C), and power capacity approaching 460 mAh.

Referring to FIGS. 42 to 45, the lithium-ion battery LIB is constituted by the soft packaging lithium-ion battery unit 930, the positive electrode 931 of the lithium-ion battery 930 is the positive electrode of the lithium-ion battery LIB, and the negative electrode 932 of the lithium-ion battery 930 is the negative electrode of the lithium-ion battery LIB. The assembling process for assembling the R8D425 rechargeable battery 900 by employing the soft packaging lithium-ion battery unit 930 includes: step 1, positioning the soft packaging lithium-ion battery unit 930 into an insulating work station for bending and shaping the tabs, and bending and shaping the positive electrode tab 931 and the negative electrode tab 932; step 2, aligning the opening of the tab recess of the insulating positive electrode positioning support frame 935 with the bended positive electrode tab 931, and pushing the same in such that the positive electrode tab 931 is inserted into the tab recess of the insulating positive electrode positioning support frame 935; step 3, aligning the opening of the tab recess of the insulating negative electrode positioning support frame 936 with the bended negative electrode tab 932, and pushing the same in such that the negative electrode tab 932 is inserted into the tab recess of the insulating negative electrode positioning support frame 936; step 4, soldering the negative electrode end cap 903 on the negative electrode tab 932 of the lithium-ion battery 930 using a spot welder; step 5, accommodating the charging/discharging controller 950, the lithium-ion battery 930 and the negative electrode end cap 903 successively into the outer packaging housing 902 along the axis direction, and positioning the same into an insulating positioning work station of the bead-sealing machine for a pressed fixation; step 6, bead-sealing the outer packaging housing 902 using the bead-sealing machine to complete the assembling of the R8D425 rechargeable battery 900; and step 7, coating or applying an insulation and finishing material outside the outer packaging housing 902 of the assembled R8D425 rechargeable battery 900 to constitute the finished R8D425 rechargeable battery 900. The heat dissipation principle of the assembled battery is the same as that of the above embodiments, which is not repeated herein.

Referring to FIGS. 46 to 52 and FIG. 54, the assembling process for assembling the charging/discharging controller 950 for the R8D425 rechargeable battery 900 may be performed directly by referring to the above assembling process, which is not repeated herein. The assembled circuit has a connecting relation as follows.

Referring to FIGS. 40 to 52 and FIG. 54, the assembled R8D425 rechargeable battery 900 constituted by employing the soft packaging lithium-ion battery unit 930 has a circuit connecting relation as follows: the positive electrode end cap 901 soldered at the V+ terminal in FIG. 54 is used as the positive electrode for the discharging output and charging input of the R8D425 rechargeable battery 900; the positive electrode 931 of the lithium-ion battery 930 is elastically crimped with the positive electrode crimping piece 961 soldered at the node Jb+ in FIG. 54, which in circuit connection sense equals to connecting the positive electrode 931 of the lithium-ion battery 930 to the node Jb+ in FIG. 54; and a circuit connection is established by crimping the charging/discharging controller housing 951 soldered at the V− terminal in FIG. 54 and the negative electrode end cap 903 soldered at the negative electrode 932 of the lithium-ion battery 930 via the outer packaging housing 902, which in circuit connection sense equals to connecting the negative electrode 932 of the lithium-ion battery 930 to the V− terminal in FIG. 54 via the negative electrode end cap 903, the outer packaging housing 902 and the charging/discharging controller housing 951, such that the negative electrode end cap 903 becomes the negative electrode for discharging output and charging input of the R8D425 rechargeable battery 900.

Figure 53:
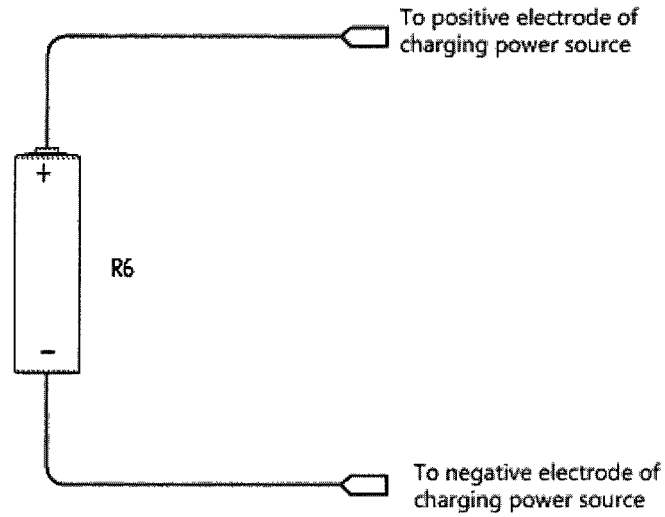
FIG. 53 is a schematic diagram illustrating a wiring principle for charging of the R6 rechargeable battery in the present disclosure.

Referring to FIG. 53, in the universal rechargeable battery constituted by employing the lithium-ion battery in the present disclosure, a computer USB interface or a universal lithium-ion battery charging adapter is used as the charging power source to charge the universal rechargeable battery. A charging device for a single rechargeable battery has a circuit having a simple structure of two electrodes and two wirings, wherein one wiring connects a positive electrode of the charging power source to the positive electrode of the universal rechargeable battery, and the other wiring connects a negative electrode of the charging power source to the negative electrode of the universal rechargeable battery. Charging devices for the R03, R1, R8D425 rechargeable batteries have the same circuit wiring principle with that of the R6 rechargeable battery. The universal rechargeable batteries of the present disclosure may be directly charged in parallel (including batteries of different types), while a required charging time may be relatively longer when the maximum output current of the charging power source is smaller than a sum of the maximum charging currents of all the universal rechargeable batteries connected in parallel.

Figure 55:
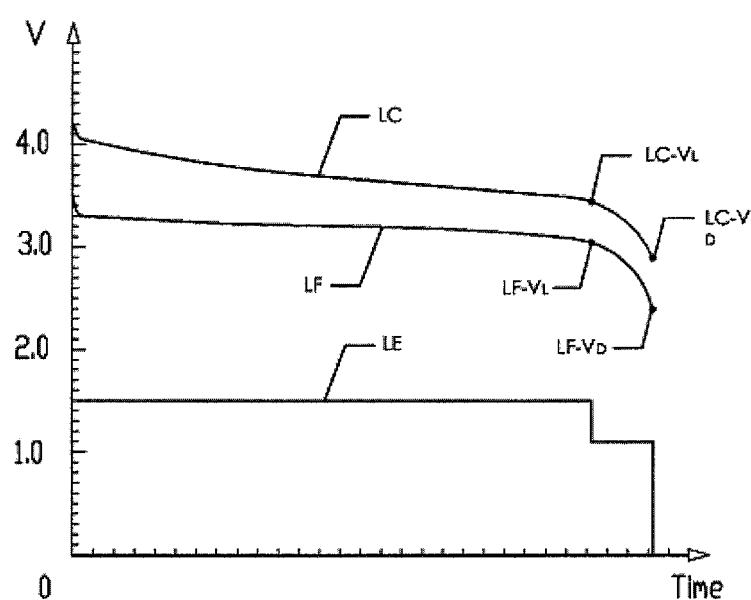
FIG. 55 is a comparison schematic diagram of a discharging voltage graph of the rechargeable battery and discharging voltage graphs of a lithium cobalt oxide ($LiCoO_2$)

Referring to FIG. 55, FIG. 55 is a comparison schematic diagram of an output voltage graph of the lithium-ion battery during a discharging process of the universal rechargeable battery constituted by employing lithium-ion battery of the present disclosure and an output voltage graph of the universal rechargeable battery. In one embodiment, the line LC is an output voltage graph of the lithium cobalt oxide ($LiCoO_2$) battery during a discharging process of the universal rechargeable battery, the line LF is an output voltage graph of the lithium iron phosphate ($LiFePO_4$) battery during a discharging process of the universal rechargeable battery, and the line LE is an output voltage graph during a discharging process of the universal rechargeable battery. A correspondence between the output voltage of the lithium-ion battery and the output voltage of the universal rechargeable battery after a full charge of the universal rechargeable battery is: in a segment in which the output voltage of the lithium-ion battery is $V_{LIB}>V_L$, the output voltage of the universal rechargeable battery is 1.5V; in a segment in which the output voltage of the lithium-ion battery is $V_L \geq V_{LIB} > V_D$, the output voltage of the universal rechargeable battery is 1.1V; and when output voltage of the lithium-ion battery is $V_{LIB} \leq V_D$, the output of the universal rechargeable battery is cutoff. The discharge graphs of the lithium-ion battery illustrated in the drawing is a schematic view at a discharging rate of 0.4 C and an environment temperature of about 25° C. The function relation between output voltage v of the lithium-ion battery and the time t under different environment temperatures and different discharging rates may be different from that illustrated in FIG. 55. In the lithium-ion batteries employing different positive electrode systems, negative electrode systems, electrolytes, and battery structures may have discharge graphs, fully charged end voltages $V_H$, discharge cutoff voltages $V_D$ and the like different from those parameters illustrated in FIG. 55.

All the above parameters provided in the present disclosure, the control parameter configurations of the embodiments, the designs of the lithium-ion battery of the embodiments and the like are provided for auxiliary descriptions of technical principle of the present disclosure, rather than limitations to the technical principle of the present disclosure.

As described above, the universal rechargeable battery constituted by employing lithium-ion battery in the present disclosure has a regulated voltage output of 1.5V and a regulated voltage output during low power of the lithium-ion battery of 1.1V, and the universal rechargeable battery may be charged using a computer USB interface or a universal lithium-ion battery charging adaptor, and has a shaping structure and discharge characteristics satisfying technical specifications of GB/T 8897.2-2013 and IEC 60086-2, therefore may be used as direct substitutes for known universal primary batteries and Ni—H rechargeable batteries. The battery has a high performance, and has a simple charging/discharging controller structure and a simple assembling process, which may facilitate the automatic mass production. A charging/discharging controller housing is used as the electrode structure for connecting the negative electrode of the lithium-ion battery into the lithium-ion battery charging/discharging control circuit, a significant inner space of the charging/discharging controller may be saved and a moveable part obstructing the sealing of the charging/discharging controller may be eliminated, and thus waterproof sealing thereof may be realized and a problem of circuit failure after getting wet may be prevented. Meanwhile, it may facilitate improving power capacity of the universal rechargeable battery and lowering the manufacturing cost. In addition, a lithium-ion battery charging/discharging control circuit is provided in the charging/discharging controller, thereby controlling and protecting the charging/discharging process of the lithium-ion battery, and improving cycle life and safety of the lithium-ion battery. In the method for controlling the universal rechargeable battery constituted by employing lithium-ion battery of the present disclosure, according to the required charging/discharging operation technical specification of the lithium-ion battery, the following advantages may be obtained by providing the charging/discharging control circuit: charging/discharging process of the lithium-ion battery may be controlled and protected; charging mode, charging rate, overcharge, overdischarge, discharging rate and discharging overheat during the process of the charging/discharging of the lithium-ion battery may be controlled and protected; cycle life and safety of the lithium-ion battery may be improved; the universal rechargeable battery may have a regulated voltage output of 1.5V and a regulated voltage output during low power of the lithium-ion battery of 1.1V, may be charged using a computer USB interface or a universal lithium-ion battery charging adaptor, and has a shaping structure and discharge characteristics satisfying technical specifications of GB/T 8897.2-2013 and IEC 60086-2, therefore may be used as direct substitutes for known universal primary batteries and Ni—H rechargeable batteries; and may be superior to the known universal primary batteries in the aspects of cycling charging/discharging, constant output voltage during the discharge process and environment protection, and may be superior to the known Ni—H batteries in the aspects of having a nominal output voltage of 1.5V, constant output voltage during the discharging process, short charging time, no memory effect and long cycle life. Performances of the universal rechargeable battery may be fully improved.

To those ordinary skilled in the art, the above described embodiment may be variously changed and modified according to the technical solution and technical concept of the present disclosure, while all of the changes and modifications are involved in the protection scope of the claims of the present disclosure.

What is claimed is:

1. A method for controlling a universal rechargeable battery constituted by employing lithium-ion battery, wherein
the universal rechargeable battery comprises therein a lithium-ion battery charging/discharging control circuit comprising a lithium-ion battery charging control circuit, a lithium-ion battery detection circuit and a DC-DC step-down regulator discharging circuit;
during a charging status, the lithium-ion battery charging/discharging control circuit detects an output voltage of the lithium-ion battery and selects a charging scheme of trickling charge, constant-current charge or constant-voltage charge to charge the lithium-ion battery according to the output voltage of the lithium-ion battery;
during a discharging status, the lithium-ion battery charging/discharging control circuit detects the output voltage of the lithium-ion battery, and performs a regulated voltage output by:
decreasing the output voltage of the lithium-ion battery to a first output voltage when the output voltage of the lithium-ion battery is greater than a low power voltage $V_L$; decreasing the output voltage of the lithium-ion battery to a second output voltage when the output voltage of the lithium-ion battery is equal to or lower than the low power voltage $V_L$; and cutoffing the regulated voltage output when the output voltage of the lithium-ion battery drops to be equal to or lower than the discharge cutoff voltage $V_D$;
wherein $V_L$ is a preset low power voltage of the lithium-ion battery, and $V_D$ is a preset discharge cutoff voltage of the lithium-ion battery; and
wherein the first output voltage ranges from 1.35V to 1.725V, and the second output voltage ranges from 0.9V to 1.35V.

2. The method for controlling a universal rechargeable battery constituted by employing lithium-ion battery according to claim 1, wherein
during the charging status, the lithium-ion battery charging/discharging control circuit detects a temperature of the lithium-ion battery, and controls the lithium-ion battery charging control circuit to stop charging of the lithium-ion battery when the temperature of the lithium-ion battery raises to a charging upper threshold temperature and restores the charging of the lithium-ion battery again when the temperature of the lithium-ion battery decreases to a value of subtracting a backlash temperature from the charging upper threshold temperature; and
during the discharging status, the lithium-ion battery charging/discharging control circuit detects a temperature of the lithium-ion battery, and controls the DC-DC step-down regulator discharging circuit to stop discharging of the lithium-ion battery when the temperature of the lithium-ion battery raises to a discharging upper threshold temperature and restores the discharging of the lithium-ion battery again when the temperature of the lithium-ion battery decreases to a value of subtracting a backlash temperature from the discharging upper threshold temperature.

3. The method for controlling a universal rechargeable battery constituted by employing lithium-ion battery according to claim 1, wherein
during the charging, the lithium-ion battery charging/discharging control circuit detects a maximum threshold output current of the charging power source, and charges the lithium-ion battery at the maximum threshold output current of the charging power source when the maximum threshold output current of the charging power source is smaller than a preset charging current value.

4. The method for controlling a universal rechargeable battery constituted by employing lithium-ion battery according to claim 1, wherein the first output voltage is 1.5V, and the second output voltage is 1.1V.

5. A method for controlling a universal rechargeable battery constituted by employing lithium-ion battery, wherein the universal rechargeable battery comprises therein a lithium-ion battery charging/discharging control circuit comprising a lithium-ion battery charging control circuit, a lithium-ion battery detection circuit and a DC-DC step-down regulator discharging circuit;

the method for controlling the universal rechargeable battery includes the following control conditions:

control condition 1, after a charging power source is connected to the universal rechargeable battery, the lithium-ion battery charging/discharging control circuit performs a charging status upon detection of the charging voltage connection, and during the charging status, the lithium-ion battery charging/discharging control circuit cutoffs the regulated discharge voltage output and performs charging of the lithium-ion battery;

control condition 2, during the charging status, the lithium-ion battery charging/discharging control circuit detects an output voltage of the lithium-ion battery and selects a charging scheme of trickling charge, constant-current charge or constant-voltage charge to charge the lithium-ion battery according to the output voltage of the lithium-ion battery, and during the charging status, the lithium-ion battery charging control circuit detects a maximum threshold output current of the charging power source, and charges the lithium-ion battery at the maximum threshold output current of the charging power source when the maximum threshold output current of the charging power source is smaller than a preset charging current value, and cutoffs the charging of the lithium-ion battery when a charging current during the constant-voltage charge is decreased to a preset fully charged determination current;

control condition 3, when the charging power source is disconnected from the universal rechargeable battery, the lithium-ion battery charging/discharging control circuit detects the disconnection of the charging power source, and discharges remaining power stored in a filter capacitor during the charging, such that a voltage across a positive electrode and a negative electrode of the universal rechargeable battery drops rapidly to be equal to or lower than a maximum open circuit voltage and a discharging status is performed, and during the discharging status, the lithium-ion battery charging/discharging control circuit cutoffs a charging and performs a regulated voltage discharge, and performs a regulated voltage output according to control condition 4, wherein the maximum open circuit voltage ranges from 1.5V to 1.725V;

control condition 4, during the discharging status, the lithium-ion battery charging/discharging control circuit detects the output voltage of the lithium-ion battery, and performs a regulated voltage output by: decreasing the output voltage of the lithium-ion battery to a first output voltage when the output voltage of the lithium-ion battery is greater than a low power voltage $V_L$;

decreasing the output voltage of the lithium-ion battery to a second output voltage when the output voltage of the lithium-ion battery is greater than a discharge cutoff voltage $V_D$ while equal to or lower than the low power voltage $V_L$, and restoring the output of the lithium-ion battery to the first voltage when the output voltage of the charged lithium-ion battery is greater than $V_L+\Delta V_1$, wherein $V_L$ is a preset low power voltage of the lithium-ion battery, $\Delta V_1$ is a preset backlash voltage of the lower power voltage detection threshold of the lithium-ion battery, and $V_D$ is a preset discharge cutoff voltage of the lithium-ion battery, wherein the first output voltage ranges from 1.35V to 1.725V, and the second output voltage ranges from 0.9V to 1.35V;

control condition 5, during the discharging status, the lithium-ion battery charging/discharging control circuit detects the output voltage of the lithium-ion battery, and cutoffs the regulated voltage output when the output voltage of the lithium-ion battery drops to be equal to or lower than the discharge cutoff voltage $V_D$ and restores the regulated voltage output according to control condition 4 when the output voltage of the charged lithium-ion battery is greater than $V_D+\Delta V_2$, wherein $\Delta V_2$ is a preset backlash voltage of the discharge cutoff voltage detection threshold of the lithium-ion battery;

control condition 6, during the charging of the universal rechargeable battery, the lithium-ion battery charging/discharging control circuit detects a temperature of the lithium-ion battery, and cutoffs the charging of the lithium-ion battery when the temperature of the lithium-ion battery raises to a charging upper threshold temperature $T'_m$ and restores the charging of the lithium-ion battery when the temperature of the lithium-ion battery decreases to be lower than $T_{CH}-\Delta T_1$, wherein $T_{CH}$ is a preset charging upper threshold temperature of the lithium-ion battery, and $\Delta T_1$ is a preset backlash temperature corresponding to a backlash voltage of the $T_{CH}$ detection threshold;

control condition 7, during the discharging of the universal rechargeable battery, the lithium-ion battery charging/discharging control circuit detects the temperature of the lithium-ion battery, and cutoffs the regulated voltage output when the temperature of the lithium-ion battery raises to a discharging upper threshold temperature $T_{DH}$ and restores the regulated voltage output when the temperature of the lithium-ion battery decreases to be lower than $T_{DH}-\Delta T_2$, wherein $T_{DH}$ is a preset discharging upper threshold temperature of the lithium-ion battery, and $\Delta T_2$ is a preset backlash temperature corresponding to a backlash voltage of the $T_{DH}$ detection threshold;

the lithium-ion battery is charged according to control condition 2 when control condition 1 determines that the charging power source is connected to the universal rechargeable battery and control condition 6 allows for the charging of the lithium-ion battery, and the charging of the lithium-ion battery is cutoff when control condition 6 prohibits the charging of the lithium-ion battery; and output power of the lithium-ion battery is stepped-down and regulated output according to control condition 4 when control condition 3 determines that the universal rechargeable battery is disconnected from the charging power source and both control condition 5 and control condition 7 allow for the discharging output of the lithium-ion battery, and the lithium-ion battery charging/discharging control circuit cutoffs the regulated voltage output when either one of control condition 5 and control condition 7 prohibits the discharging output of the lithium-ion battery.

* * * * *